(12) United States Patent
Seo et al.

(10) Patent No.: US 7,193,359 B2
(45) Date of Patent: Mar. 20, 2007

(54) LIGHT EMITTING DEVICE AND METHOD OF MANUFACTURING THE SAME

(75) Inventors: Satoshi Seo, Kanagawa (JP); Yasuo Nakamura, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 10/255,449

(22) Filed: Sep. 26, 2002

(65) Prior Publication Data

US 2003/0062826 A1  Apr. 3, 2003

(30) Foreign Application Priority Data

Sep. 28, 2001  (JP) .............................. 2001-304600

(51) Int. Cl.
 *H01L 51/30* (2006.01)
 *H01L 51/00* (2006.01)
(52) U.S. Cl. .................... 313/503; 313/504; 428/690
(58) Field of Classification Search ........ 313/498–512; 428/690, 917
 See application file for complete search history.

(56) References Cited

U.S. PATENT DOCUMENTS

| | | | | |
|---|---|---|---|---|
| 4,279,726 A | * | 7/1981 | Baird et al. | 204/192.26 |
| 6,060,826 A | | 5/2000 | Ueda et al. | 313/498 |
| 6,114,088 A | * | 9/2000 | Wolk et al. | 430/273.1 |
| 6,208,077 B1 | | 3/2001 | Hung | 313/506 |
| 6,246,179 B1 | * | 6/2001 | Yamada | 315/169.3 |
| 6,288,487 B1 | * | 9/2001 | Arai | 313/506 |
| 6,320,311 B2 | * | 11/2001 | Nakaya et al. | 313/506 |
| 6,369,507 B1 | * | 4/2002 | Arai | 313/506 |
| 6,433,487 B1 | | 8/2002 | Yamazaki | 315/169.3 |
| 6,501,217 B2 | | 12/2002 | Beierlein et al. | 313/504 |

(Continued)

FOREIGN PATENT DOCUMENTS

EP  0 614 226  9/1994

(Continued)

OTHER PUBLICATIONS

English Abstract re Japanese Patent Application No. JP 2001-043980 published Feb. 16, 2001.

(Continued)

*Primary Examiner*—Karabi Guharay
(74) *Attorney, Agent, or Firm*—Cook, Alex, McFarron, Manzo, Cummings & Mehler, Ltd.

(57) ABSTRACT

A measure for improving the light emission efficiency of a light emitting element without degrading characteristics of anode materials used in prior art is provided in manufacture of an upward emission type light emitting element. The present invention is characterized in that nitride or carbide of a metal element belonging to one of Group 4, 5, and 6 in the periodic table (hereinafter referred to as metal compound) is used as the material for forming an anode of a light emitting element. The metal compound has a work function equal to or larger than the work function of conventional anode materials. Therefore, injection of holes from the anode can be improved ever more. Also, with regard to conductivity, the metal compound is smaller in resistivity than ITO. It therefore can fulfil the function as a wire and can lower the drive voltage in the light emitting element compared to prior art.

22 Claims, 16 Drawing Sheets

U.S. PATENT DOCUMENTS

| | | | |
|---|---|---|---|
| 6,501,466 B1 | 12/2002 | Yamagishi et al. | 345/204 |
| 6,515,428 B1* | 2/2003 | Yeh et al. | 315/169.3 |
| 6,528,824 B2 | 3/2003 | Yamagata et al. | |
| 6,537,901 B2* | 3/2003 | Cha et al. | 438/592 |
| 6,555,969 B2 | 4/2003 | Yamazaki | 315/169.3 |
| 6,597,110 B1* | 7/2003 | Thompson et al. | 313/506 |
| 6,599,818 B2* | 7/2003 | Dairiki | 438/486 |
| 6,838,836 B2* | 1/2005 | Seo et al. | 315/169.3 |
| 6,908,695 B2 | 6/2005 | Seo et al. | |
| 2001/0026123 A1* | 10/2001 | Yoneda | 313/504 |
| 2001/0026125 A1* | 10/2001 | Yamazaki et al. | 313/505 |
| 2002/0021088 A1* | 2/2002 | Howard et al. | 313/504 |
| 2002/0045066 A1 | 4/2002 | Beierlein et al. | 428/690 |
| 2002/0117962 A1 | 8/2002 | Beierlein et al. | 313/504 |
| 2002/0180374 A1 | 12/2002 | Yamazaki | 315/169.3 |
| 2003/0117071 A1* | 6/2003 | Lee et al. | 313/512 |
| 2003/0118865 A1 | 6/2003 | Marks et al. | 428/690 |
| 2004/0000865 A1 | 1/2004 | Yamazaki | 313/506 |
| 2004/0000866 A1* | 1/2004 | Seo et al. | 313/506 |
| 2005/0029930 A1 | 2/2005 | Yamazaki | 313/503 |

FOREIGN PATENT DOCUMENTS

| | | |
|---|---|---|
| EP | 1 081 767 A2 | 3/2001 |
| EP | 1 102 234 | 5/2001 |
| JP | 08-288069 | 11/1996 |
| JP | 10-289784 | 10/1998 |
| JP | 11-297477 | 10/1999 |
| JP | 2000-077191 | 3/2000 |
| JP | 2001-043980 | 2/2001 |
| JP | 2001-143874 | 5/2001 |
| JP | 2001-147659 | 5/2001 |
| JP | 2001-507167 | 5/2001 |
| JP | 2002-015860 | 1/2002 |
| WO | WO 99/59379 | 11/1999 |
| WO | WO 00/16361 | 3/2000 |
| WO | WO 03/019598 | 3/2003 |

OTHER PUBLICATIONS

English Abstract re Japanese Patent Application No. JP 2002-015860 published Jan. 18, 2002.

Australian Patent Office Search Report re Singapore Patent Application No. SG 200205773-5, dated Jun. 29, 2004.

US 6,809,377, 10/2004, Yamazaki (withdrawn)

* cited by examiner

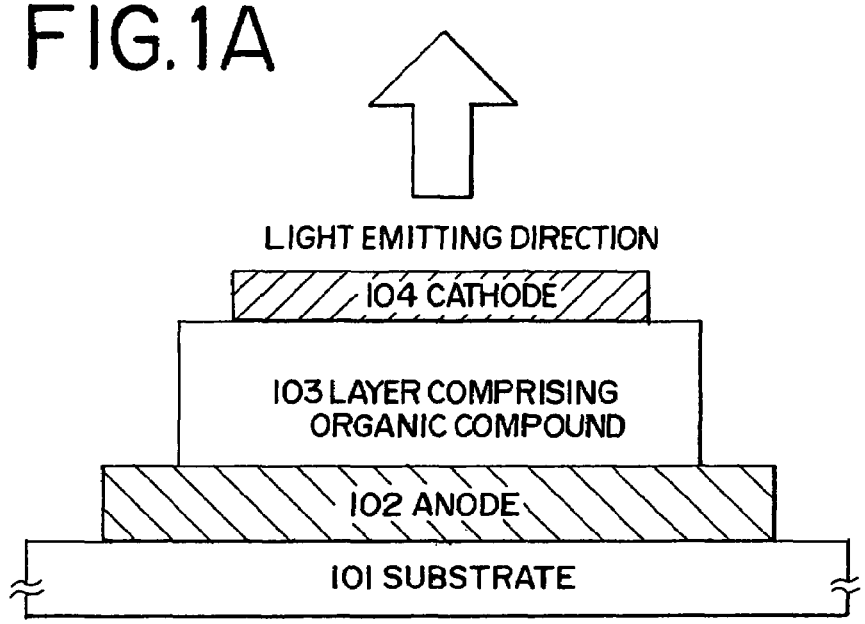
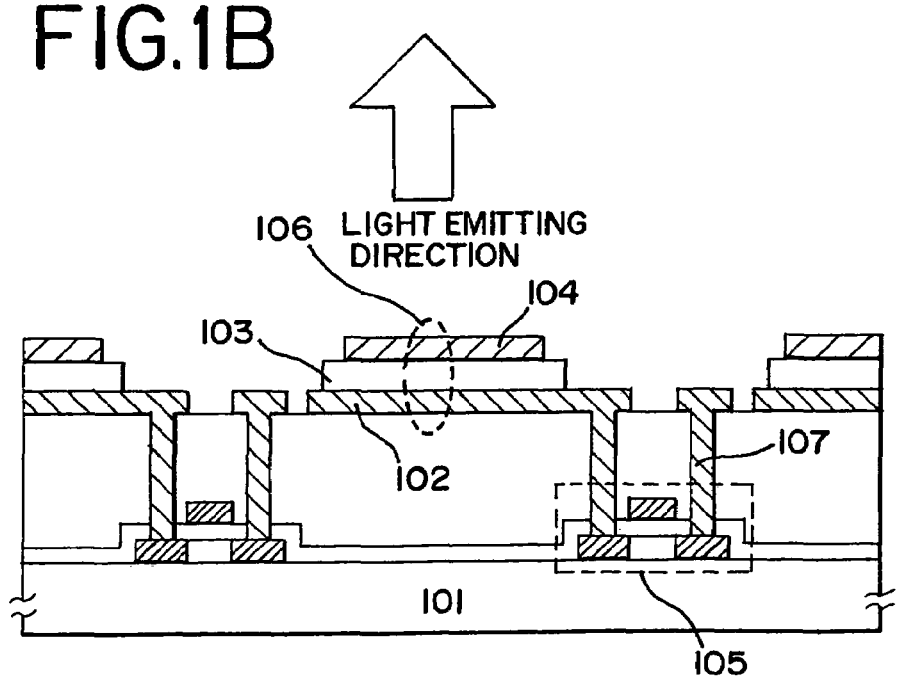

FIG. 4
LIGHT EMITTING DIRECTION
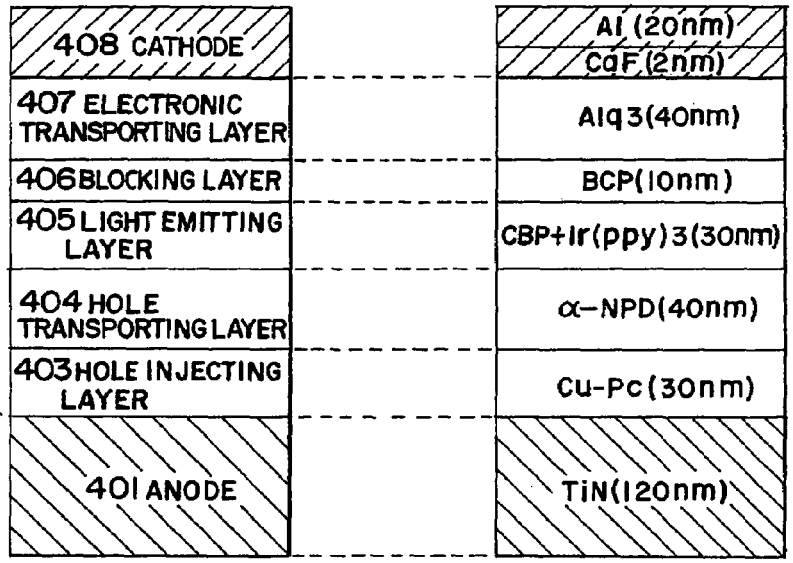
FIG. 5
LIGHT EMITTING DIRECTION
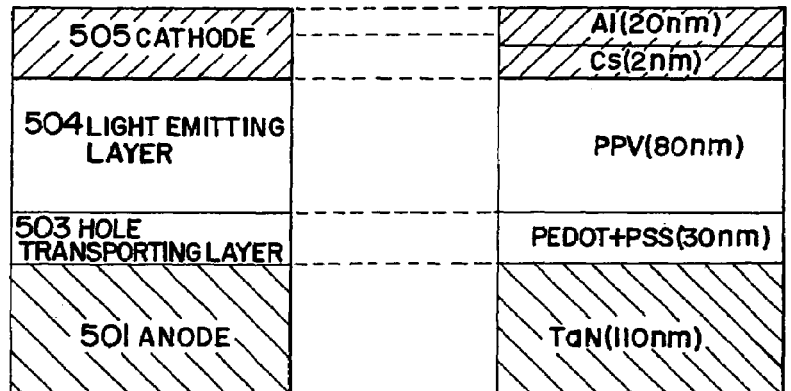

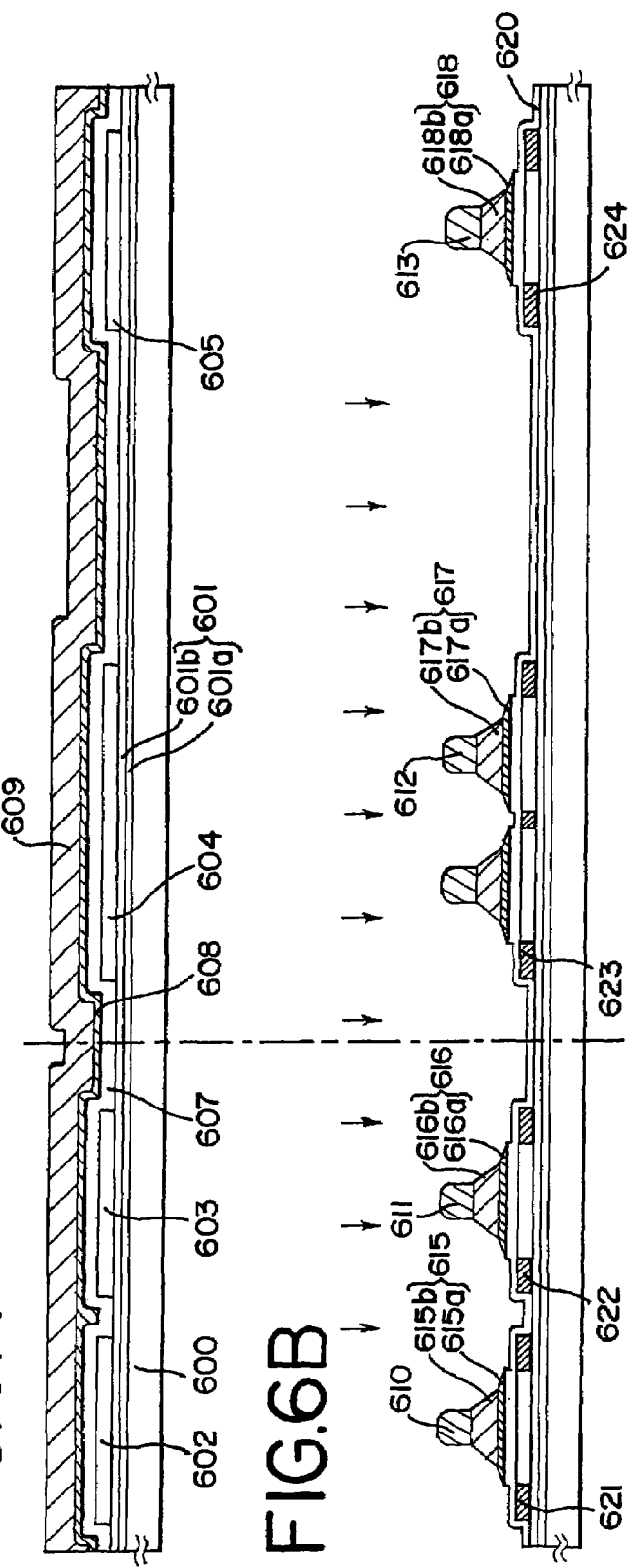

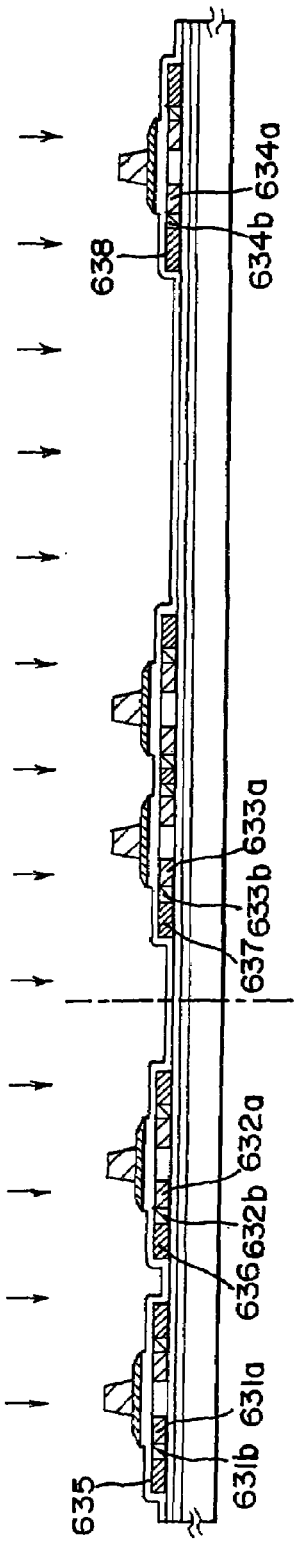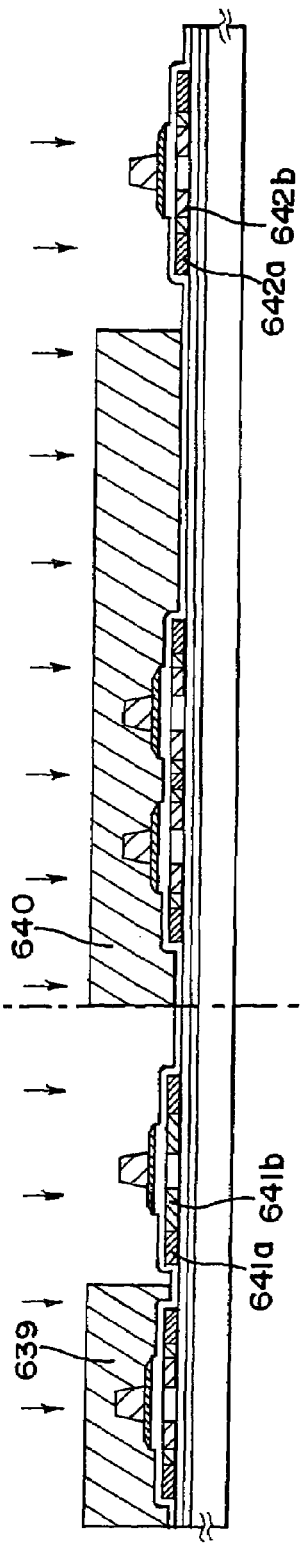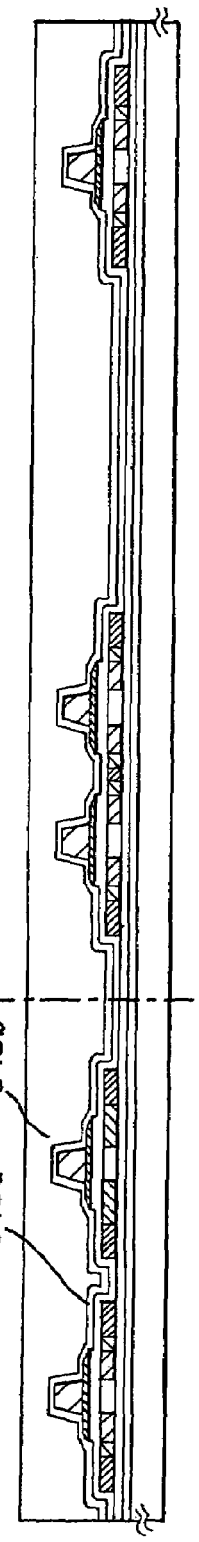

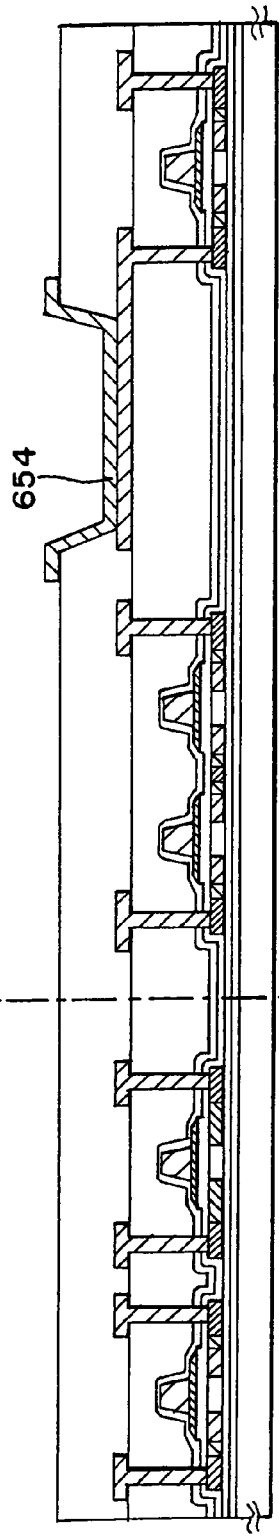
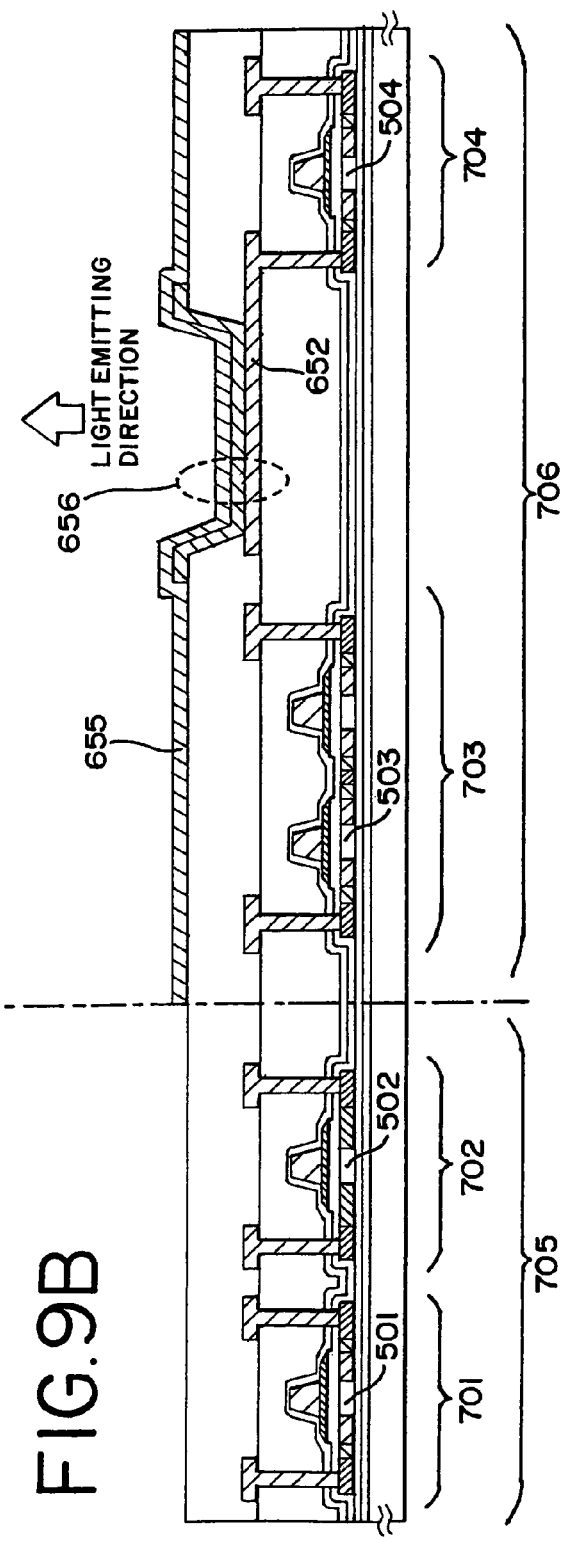
FIG.9A
FIG.9B

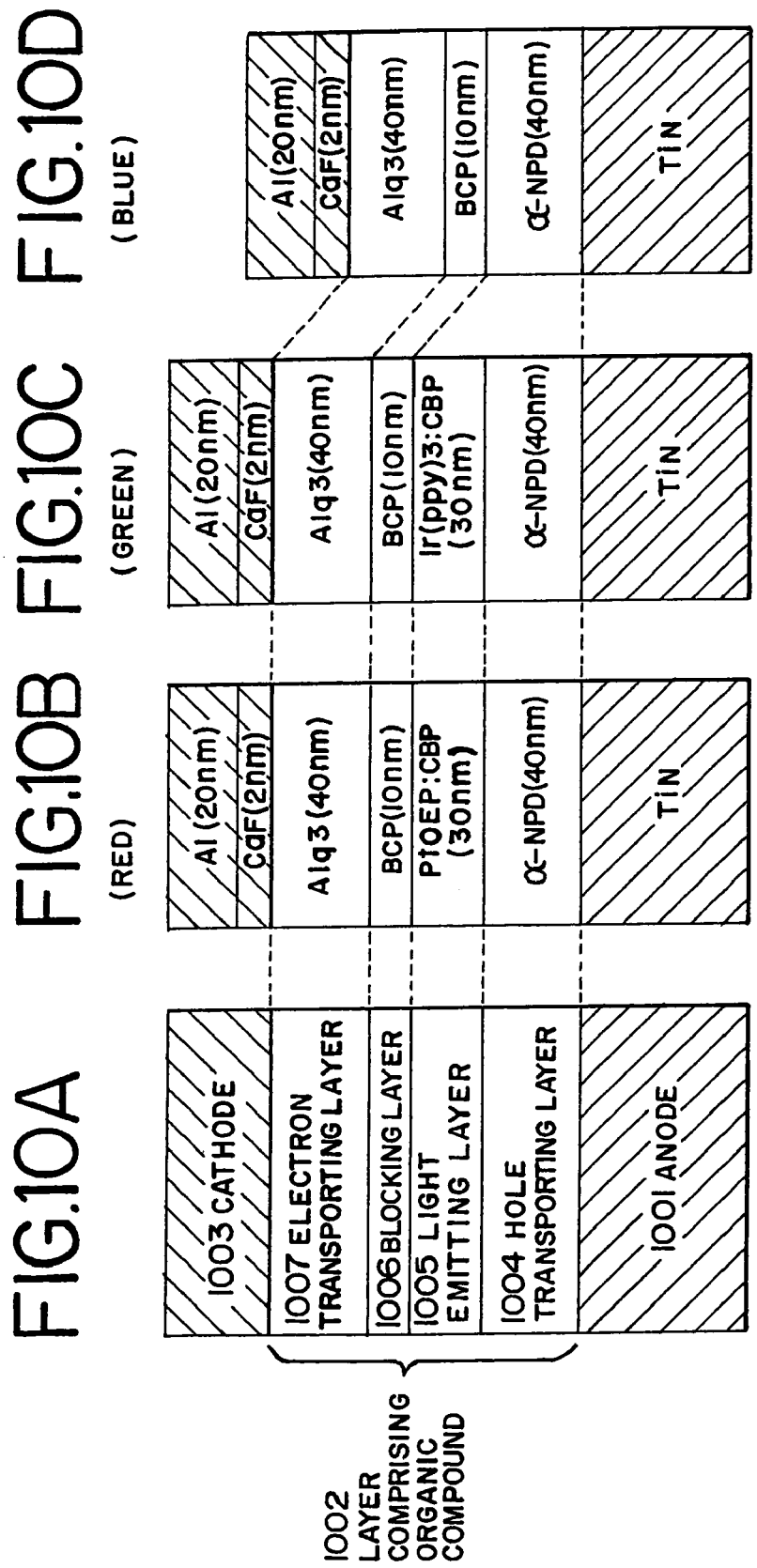

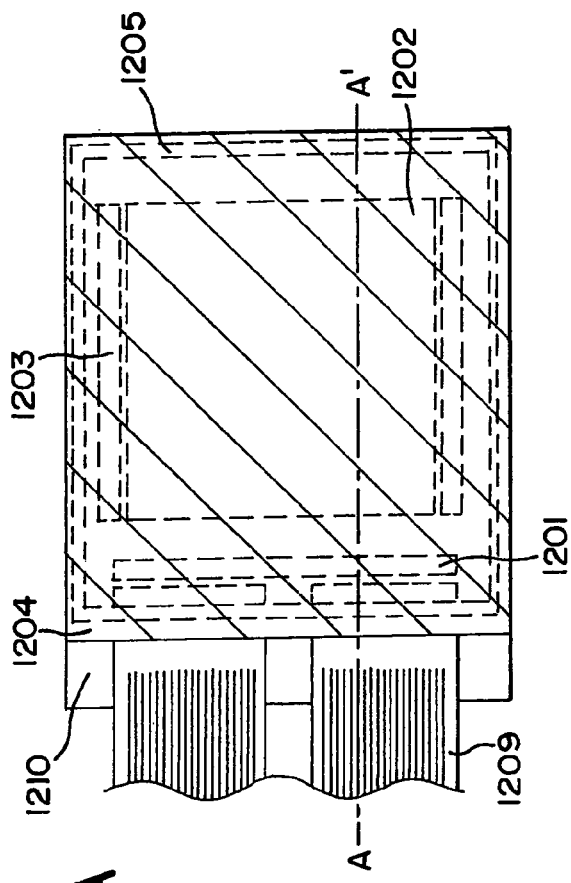
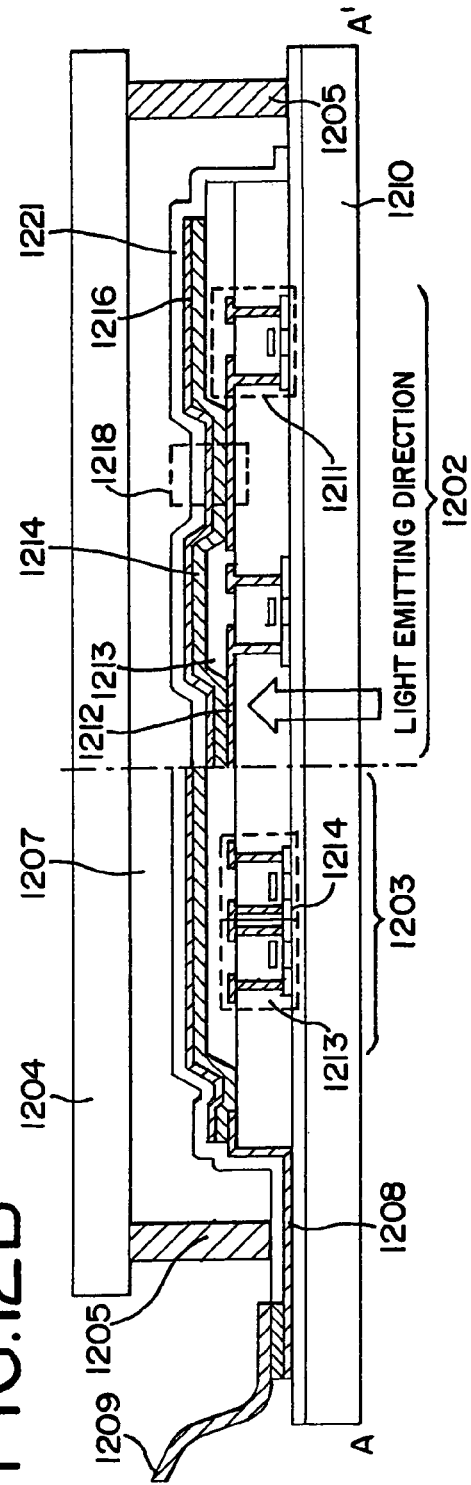
FIG.12A
FIG.12B

LIGHT EMITTING DIRECTION

LIGHT EMITTING DEVICE AND METHOD OF MANUFACTURING THE SAME

BACKGROUND OF THE INVENTION

1. Field of the Invention

The present invention relates to a light emitting device using a light emitting element which has a layer containing an organic compound between a pair of electrodes and which can give fluorescence or luminescence by receiving an electric field. The light emitting device referred to in the present specification is an image display device, a light emitting device or a light source. Additionally, the following are included in examples of the light emitting device: a module wherein a connector, for example, a flexible printed circuit (FPC) or a tape automated bonding (TAB) tape, or a tape carrier package (TCP)) is set up onto a light emitting element; a module wherein a printed wiring board is set to the tip of a TAB tape or a TCP; and a module wherein integrated circuits (IC) are directly mounted on a light emitting element in a chip on glass (COG) manner.

2. Related Art

A light emitting element is an element which emits light by receiving an electric field. It is said that the luminescence mechanism thereof is based on the following: by applying a voltage to a layer comprising at least one organic compound sandwiched between electrodes, electrons injected from the cathode and holes injected from the anode are recombined in the layer comprising at least one organic compound to form molecules in an exciting state (hereinafter referred to as "molecular exciton"); and energy is radiated when the molecular exciton moves back toward the ground state thereof.

The kind of the molecular exciton which is made from the organic compound may be a singlet exciton state or a triplet exciton state. In the present specification, luminescence (that is, light emission) may be based on the contribution of any one of the two.

In such a light emitting element, its layer comprising at least one organic compound is usually made of a thin film having a thickness below 1 µm. The light emitting element is a spontaneous light type element, wherein the layer comprising at least one organic compound itself emits light. Therefore, backlight, which is used in conventional liquid crystal displays, is unnecessary. As a result, the light emitting element has a great advantage that it can be produced into a thin and light form.

The time from the injection of carriers to the recombination thereof in the layer comprising at least one organic compound having a thickness of about 100 to 200 nm is about several tens nanoseconds in light of carrier mobility in the layer comprising at least one organic compound. A time up to luminescence, which includes the step from the recombination of the carrier to luminescence, is a time in order of microseconds or less. Therefore, the light emitting element also has an advantage that the response thereof is very rapid.

The light emitting element draw attention as next generation flat panel display element due to the characteristics of thin and light weight, high responsibility, and direct low voltage driving. Visibility of the light emitting element is comparatively good because the light emitting element is a self-emission type and wide viewing angle. Thus, the light emitting element is considered as an effective element for using a display screen of a portable apparatus.

In light emitting devices formed by arranging such light emitting elements in a matrix form, driving methods called passive matrix driving (simple matrix type) and active matrix driving (active matrix type) can be used. However, in the case in which the density of pixels increases, it is considered that the active matrix type wherein a switch is fitted to each pixel (or each dot) is more profitable since lower voltage driving can be attained.

Moreover, as an active-matrix type light emitting device shown in FIG. 17, it has the light emitting element 1707 in which TFT 1705 on a substrate 1701 and the anode 1702 are electrically connected, a layer comprising at least one organic compound 1703 is formed on an anode 1702, and a cathode 1704 is formed on the layer comprising at least one organic compound 1703. In addition, as anode materials in the light emitting element 1707, in order to make hole injection smooth, conductive materials of a large work function is used, and conductive materials that are transparent to the light, such as ITO (indium tin oxide) and IZO (indium zinc oxide), are used as a material which fulfills the practical characteristic. The light generated at the organic light emitting layer 1703 of the light emitting element 1707 radiates toward the TFT 1705 through the anode 1702 is a favored structure (hereinafter referred to as a bottom emission) of the light emission.

However, in the bottom emission structure, even if resolution is tried to be raised, TFT and wiring may be interfered due to their arrangement. Thus, a problem of a restriction of an aperture ratio is occurred.

In recent years, the structure that the light radiates upward from the cathode side (hereinafter referred to as a top emission) is devised. Concerning to the top emission light emitting device is disclosed in unexamined patent publication No. 2001-43980. In the case of the top emission type, the aperture ratio can be enlarged than that in the bottom emission type, so that the light emitting element which can obtain higher resolution can be formed.

However, in the case of the top emission light emitting device, if anode materials that is transparent to the light is used as conventionally, light is emitted from not only the cathode side but also the anode side, thereby the light emitting efficiency is lowered.

If the film having light blocking effect against the light emitted from the anode side is formed, one more manufacturing step must be added.

Further, if the anode is formed by using metal materials having a light blocking effect, additional manufacturing steps are unnecessary. However, these materials have smaller work function and spend higher material cost than ITO which is used conventionally. In case of using metal materials for the anode, an adhesion of the anode and the organic compound film is deteriorated in comparison with ITO.

SUMMARY OF THE INVENTION

The present invention, in the manufacturing step of the light emitting element of the top emission, is to provide means of improving a light emitting efficiency of the light emitting element without deterioration of characteristics of anode materials that is used conventionally.

The present invention is characterized in that a conductive film having large work function and a light-shielding ability is used as the material of an anode of a light emitting element.

In this specification, a film having a light-shielding ability means that the film allows visible light to transmit at a transmittance of less than 10%. By using a light-shielding conductive film as an anode material, an anode of a light emitting element can be formed at the same time a wire for electrically connecting the anode to a thin film transistor (hereinafter referred to as TFT) for driving the light emitting element is formed in manufacturing an active matrix light emitting device. Accordingly, the present invention is characterized by omitting the process of forming a light-shielding film and the like, which is necessary when a transparent conductive film is used in prior art. A conductive film in this specification refers to a film having a resistivity of $1 \times 10^{-2}$ Ωcm or less.

The anode material used in the present invention has a work function equal to or larger than the work function of ITO or IZO, which are used as an anode material in prior art. By using this material for an anode, injection of holes from the anode can be improved ever more. Also, with regard to conductivity, this anode material is smaller in resistivity than ITO. It therefore can fulfil the function as the wire described above and can lower the drive voltage in the light emitting element compared to prior art.

Furthermore, the anode material used in the present invention is superior in adherence when laminated to a layer comprising at least one organic compound to an anode formed from a light-shielding conductive metal film. This is supposedly because the anode material of the present invention is a compound such as nitride or carbide containing a metal (hereinafter referred to as metal compound) and nitrogen or carbon contained in the metal compound locally forms covalent bonds with carbon, oxygen, hydrogen, or nitrogen contained in the organic compound. This leads to a conclusion that, in manufacture of a light emitting element, forming a layer comprising at least one organic compound on an anode that is composed of a metal compound is superior in terms of film formation to forming a layer comprising at least one organic compound on an anode that is formed from a metal film.

A structure of the present invention disclosed herein is a light emitting device having an anode, a cathode, and a layer comprising at least one organic compound, characterized in that the layer comprising at least one organic compound is interposed between the anode and the cathode and that the anode is formed of a metal compound.

Another structure of the present invention is a light emitting device having an anode, a cathode, and a layer comprising at least one organic compound, characterized in that the layer comprising at least one organic compound is interposed between the anode and the cathode and that the anode contains as a metal compound an element belonging to Group 4, 5, or 6 in the periodic table.

Another structure of the present invention is a light emitting device having an anode, a cathode, and a layer comprising at least one organic compound, characterized in that the layer comprising at least one organic compound is interposed between the anode and the cathode and that the anode contains as a metal compound nitride or carbide of an element belonging to Group 4, 5, or 6 in the periodic table.

Another structure of the present invention is a light emitting device having a TFT provided on an insulating surface and a light emitting element, characterized in that the light emitting element has an anode, a cathode, and a layer comprising at least one organic compound, that the TFT is electrically connected to the anode, and that the anode is formed of a metal compound.

Another structure of the present invention is a light emitting device having a TFT provided on an insulating surface and a light emitting element, characterized in that the light emitting element has an anode, a cathode, and a layer comprising at least one organic compound, that the TFT is electrically connected to the anode, and that the anode contains as a metal compound comprising an element belonging to Group 4, 5, or 6 in the periodic table.

Another structure of the present invention is a light emitting device having a TFT provided on an insulating surface and a light emitting element, characterized in that the light emitting element has an anode, a cathode, and a layer comprising at least one organic compound, that the TFT is electrically connected to the anode, and that the anode contains as a metal compound nitride or carbide of an element belonging to Group 4, 5, or 6 in the periodic table.

In the above structures, the present invention is characterized in that an anode is formed of a material having a resistivity of $1 \times 10^{-2}$ Ωcm or less.

In the above structures, the present invention is characterized in that an anode is formed of a material having a work function of 4.7 eV or more.

In the above structures, the present invention is characterized in that an anode is formed of one selected from the group consisting of titanium nitride, zirconium nitride, titanium carbide, zirconium carbide, tantalum nitride, tantalum carbide, molybdenum nitride, and molybdenum carbide.

In addition to the above structures, the present invention is characterized in that the anode has a visible light transmittance of less than 10% when the anode formed of a metal compound has a light-shielding ability, and that the cathode is formed from a light-transmissive conductive film and has a visible light transmittance of 40% or more in this case. In order to secure a transmittance of 40% or more for the cathode, a conductive film highly transmissive of light is used and the conductive film for forming the cathode is made thin to a degree that enables the film to obtain a conductivity high enough to drive the light emitting element. The present invention is also characterized in that the conductive film for forming the cathode is formed of a material having a resistivity of $1 \times 10^{-2}$ Ωcm or less.

In the present invention, an anode of a light emitting element is formed of nitride or carbide of an element that belongs to Group 4, 5, or 6 in the periodic table. These metal compounds have a work function of 4.7 eV or more. The work function of these metal compounds can be improved even more by ultraviolet ray irradiation treatment in an ozone atmosphere (hereinafter referred to as UV ozone treatment). For example, titanium nitride (TiN) has a work function of 4.7 eV, which can be improved by the UV ozone treatment to 5.0 eV or more. Tantalum nitride (TaN) can similarly improve its work function by the UV treatment. Conventional light-shielding anode materials are metals belonging to Group 5 or 6 in the periodic table and these metals each have a work function of less than 4.7 eV. The anode material of the present invention is formed of a metal compound and is superior to them in terms of injection of holes. Therefore the anode of the present invention can improve element characteristics of a light emitting element.

In manufacturing a light emitting device in accordance with the present invention, an anode is formed of a metal compound film and then the anode surface may be subjected to UV ozone treatment to form a layer comprising at least one organic compound on the anode.

Another structure of the present invention is a method of manufacturing a light emitting device, including: forming an anode on an insulating surface; subjecting the anode surface to UV ozone treatment; forming a layer comprising at least one organic compound on the anode; and forming a cathode on the layer comprising at least one organic compound, the method characterized in that a light-shielding metal compound is used for the anode. The light-shielding metal compound specifically refers to nitride or carbide of an element that belongs to Group 4, 5, or 6 in the periodic table.

The metal compound used in the present invention has a resistivity of $1 \times 10^{-4}$ $\Omega$cm or more and less than $1 \times 10^{-2}$ $\Omega$cm in contrast to a normal metal film of single component which has a resistivity of less than $1 \times 10^{-4}$ $\Omega$cm. However, the metal compound has a conductivity sufficient to form an anode of a light emitting element since ITO that is a conventional anode material has a resistivity of $1 \times 10^{-2}$ $\Omega$cm or more.

A light emitting device of the present invention can be both an active matrix light emitting device having a light emitting element that is electrically connected to a TFT and a passive matrix light emitting device.

Light emission obtained from a light emitting device of the present invention is either light emission from singlet excitation or light emission from triplet excitation, or both.

BRIEF DESCRIPTION OF THE DRAWINGS

In the accompanying drawings:

FIGS. 1A and 1B are diagrams illustrating the element structure of a light emitting device of the present invention;

FIG. 4 is a diagram illustrating the element structure of a low-molecular type light emitting device of the present invention;

FIG. 5 is a diagram illustrating the element structure of a high-molecular type light emitting device of the present invention;

FIGS. 6A to 6C are diagrams illustrating a process of manufacturing a light emitting device in accordance with the present invention;

FIGS. 7A to 7C are diagrams illustrating a process of manufacturing a light emitting device in accordance with the present invention;

FIGS. 9A and 9B are diagrams illustrating a process of manufacturing a light emitting device in accordance with the present invention;

FIGS. 10A to 10D are diagrams illustrating element structures in a light emitting device of the present invention;

FIGS. 12A and 12B are diagrams illustrating the element structure in a light emitting device of the present invention;

DETAILED DESCRIPTION OF THE PREFERRED EMBODIMENTS

[Embodiment Mode]

Figure 2A:
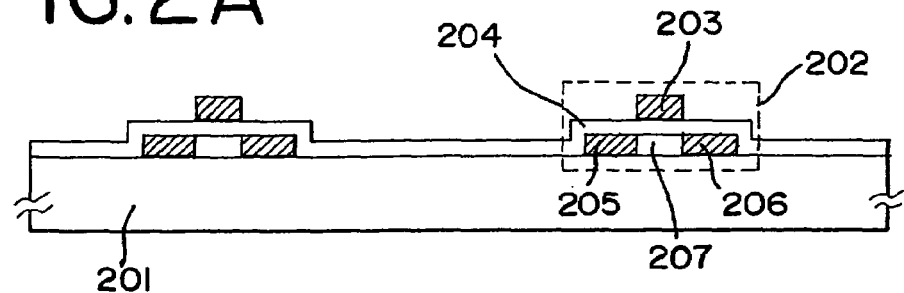
FIGS. 2A to 2D are diagrams illustrating a process of manufacturing a light emitting device in accordance with the present invention.

An embodiment mode of the present invention will be described with reference to FIGS. 1A and 1B. A light emitting device of the present invention has a light emitting element with an element structure shown in FIG. 1A.

As shown in FIG. 1A, an anode 102 is formed on a substrate 101. A layer comprising at least one organic compound 103 is in contact with the anode 102, and a cathode 104 is in contact with the layer comprising at least one organic compound 103. Holes are injected from the anode 102 to the layer comprising at least one organic compound 103, and electrons are injected from the cathode 104 to the layer comprising at least one organic compound 103. The holes and the electrons are re-combined in the layer comprising at least one organic compound 103, so that the layer 103 emits light.

The layer comprising at least one organic compound 103 has, in addition to a light emitting layer, one or plural layers selected from layers that have different functions for carriers, such as a hole injection layer, a hole transporting layer, a blocking layer, an electron transporting layer, and an electron injection layer. These layers are laid on top of one another to form the layer comprising at least one organic compound 103.

In the layer comprising the organic compound 103, inorganic materials may be used in the hole injection layer, the hole transporting layer, the electron transporting layer, and the electron injection layer. For example, the inorganic materials can be a diamond like carbon (DLC), Si, Ge, or oxides or nitrides combined with these elements. Elements such as P, B, N, and the like may be appropriately doped with the inorganic materials. Further, the inorganic materials can be oxides, nitrides, and fluorides that is combined with the alkaline metal or the alkaline earth metal, or compounds or alloys that are composed of these metals combined at least with Zn, Sn, V, Ru, Sm, and In.

Above-mentioned materials are one example, the illuminant may be formed by appropriately laminating the following functioning layers; the hole injection transporting layer, the hole transporting layer, the electron injection transporting layer, the electron transporting layer, the light emitting layer, the electronic block layer, and the hole block layer that are formed by the inorganic materials. In addition, the mixed layer or the mixed junction that are a combination of these layers may be formed.

The anode 102 is formed of a light-shielding metal compound. The cathode 104 is formed from a light-transmissive conductive film and has a transmittance of 40% or more. Therefore, light emitted from the layer comprising at least one organic compound 103 is transmitted through the cathode 104 and exits to the outside.

In this embodiment mode, a metal compound refers to nitride or carbide of a metal element that belongs to Group 4, 5, or 6 in the periodic table. Preferably, the metal compound is selected from the group consisting of titanium nitride, zirconium nitride, titanium carbide, zirconium carbide, tantalum nitride, tantalum carbide, molybdenum nitride, and molybdenum carbide.

Figure 15:
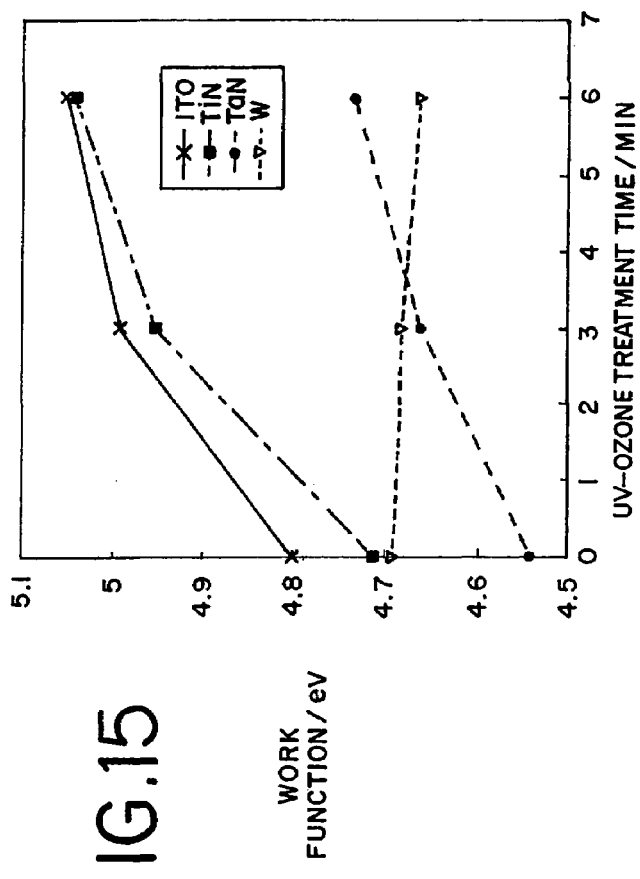
FIG. 15 is a graph showing results of measuring the work function value through UV ozone treatment.

The metal compound has a work function of 4.7 eV or more. For example, the work function of titanium nitride (TiN) is 4.7 eV. The work function of the metal compound can be improved even more by ultraviolet ray irradiation treatment in an ozone atmosphere (UV ozone treatment) or by plasma treatment. FIG. 15 shows results of measuring changes in work function in relation to UV ozone treatment time. The work function here is measured in the air by photoelectron spectroscopy using "Photoelectron Spectroscope AC-2", a product of RIKEN KEIKI CO., LTD. FIG. 15 shows that the work function of titanium nitride is increased from 4.7 eV to 5.05 eV by 6 minutes of UV ozone treatment. A similar increase in work function is observed in tantalum nitride.

In contrast to this, tungsten (W), a metal of single component, shows almost no change in work function even through UV ozone treatment. The results indicate that UV ozone treatment has no effect of increasing work function of a metal of single component but increases the work function of the metal compound of the present invention alone.

FIG. 1B shows an active matrix light emitting device in which a TFT 105 formed on a substrate 101 and a light emitting element 106 are electrically connected to each other.

When manufacturing the active matrix light emitting device having a light emitting element illustrated in FIG. 1A, a wire 107 is formed to input an electric signal to one of source and drain of the TFT 105 and to output the signal from the other.

In this embodiment mode, the anode 102 can double as a wire. Similar to the one shown in FIG. 1A, a layer comprising at least one organic compound 103 and a cathode 104 are layered on the anode to complete the light emitting element 106.

Now, a description will be given with reference to FIGS. 2A to 3C on a method of manufacturing an active matrix light emitting device in accordance with the present invention.

In FIG. 2A, a TFT 202 is formed on a substrate 201. The substrate 201 has light transmissivity of and a glass substrate is employed for 201. A quartz substrate may be employed instead. The TFT 202 is formed by a known method, and the TFT 202 has at least a gate electrode 203, a source region 205, a drain region 206, and a channel forming region 207. A gate insulating film 204 is interposed between the gate electrode 203 and the regions 205, 206, and 207. The channel forming region 207 is formed between the source region 205 and the drain region 206.

Figure 2B:
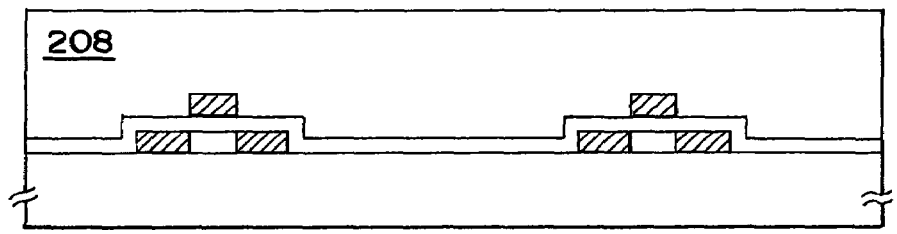
Figure 2C:
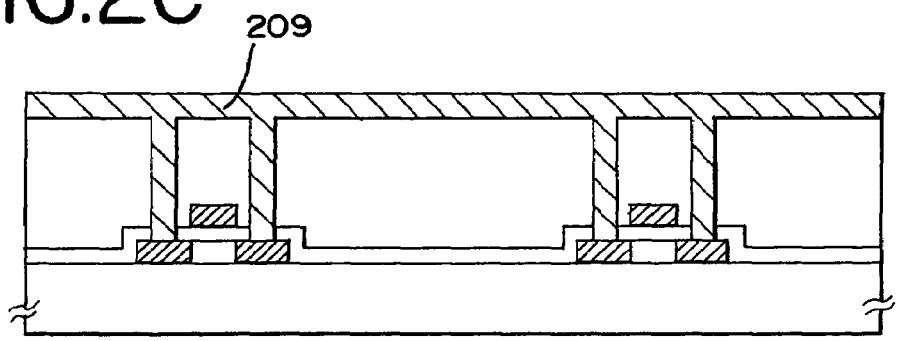

As shown in FIG. 2B, an interlayer insulating film 208 with a thickness of 1 to 2 μm covers the TFT 202. Openings are formed in the interlayer insulating film 208 and then a film of a light-shielding metal compound (hereinafter referred to as metal compound film 209) is formed on the interlayer insulating film 208 by sputtering (FIG. 2C). The material of the interlayer insulating film is an insulating film containing silicon, such as a silicon oxide film, a silicon nitride film, or a silicon oxynitride film. The interlayer insulating film may be an organic resin film such as a polyimide film, a polyamide film, an acrylic film (including a photosensitive acrylic film), or a BCB (benzocyclobutene) film.

For the formation of the metal compound film 209, there can be used nitride or carbide of a metal element that belongs to Group 4, 5, or 6 in the periodic table. Preferably, the metal compound film is formed using titanium nitride, zirconium nitride, titanium carbide, zirconium carbide, tantalum nitride, tantalum carbide, molybdenum nitride, or molybdenum carbide.

Figure 2D:
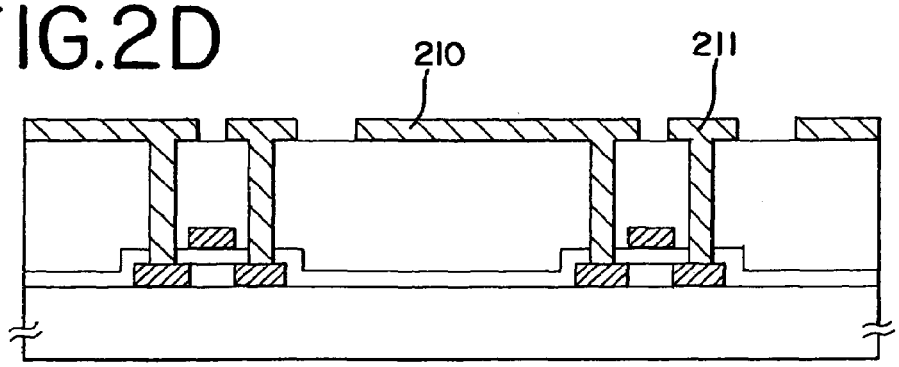

Next, as shown in FIG. 2D, the metal compound film 209 is patterned to form a wire 211 that is electrically connected to the TFT 202. At the same time, an anode 210 that doubles as a wire is formed in the present invention. The wire and the anode thus can be formed simultaneously, eliminating a manufacture step for forming an anode.

Either of dry etching and wet etching can be employed for the patterning.

Figure 3A:
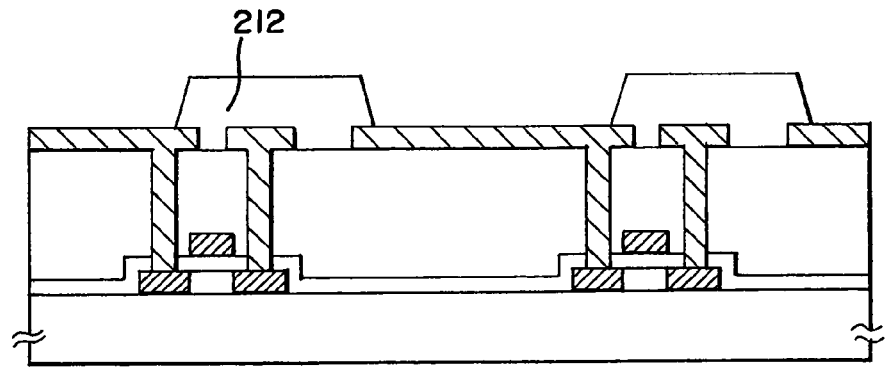
FIGS. 3A to 3C are diagrams illustrating a process of manufacturing a light emitting device in accordance with the present invention.

Next, insulating layers 212 are formed to cover gaps between the anodes as shown in FIG. 3A. The material used to form the interlayer insulating film 208 can be employed for the insulating layers. Preferably, the insulating layers are each 1 to 2 μm in thickness.

Figure 3B:
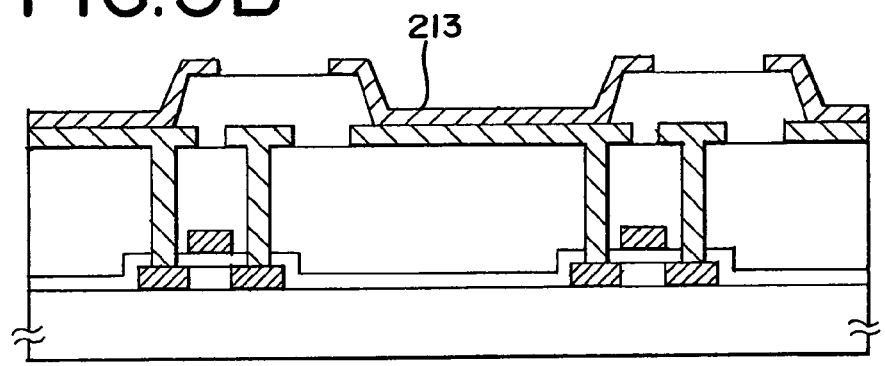

Next, a layer comprising at least one organic compound 213 is formed on the anode 210 (FIG. 3B). The material of the layer comprising at least one organic compound 213 can be a known low-, high-, or intermediate-molecular based organic compound. An intermediate-based organic material can be defined that an aggregate of an organic compound which does not have subliming property or dissolving property (preferably, an aggregate which has molecularity of 10 or less), or an organic compound which has a molecular chain length of 5 μm of less (preferably 50 nm or less).

Figure 3C:
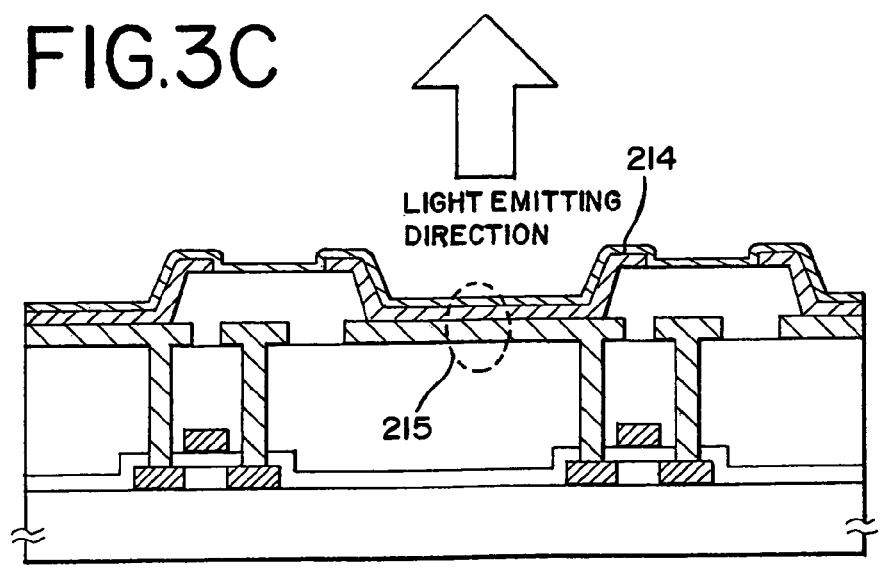

A cathode 214 is formed on the layer comprising at least one organic compound 213 to complete a light emitting element 215. In this embodiment mode, light generated in the layer comprising at least one organic compound 213 is emitted from the cathode 214 side and therefore the cathode 214 preferably has a visible light transmittance of 40% or more (FIG. 3C).

A preferred material of the cathode 214 is one that has a small work function for improving injection of electrons from the cathode 214. For example, an alkali metal or alkaline earth metal is used alone or is combined with other materials to form a laminate or to form an alloy.

A top gate TFT is used as an example in the description here. However, there is no particular limitation and the present invention is also applicable to a bottom gate TFT, a forward stagger TFT, or other TFT structures.

With this structure, light emitted by recombination of carriers in the layer comprising at least one organic compound 213 can exit from the cathode 214 side efficiently without allowing the light to escape from the anode 210 side.

More detailed descriptions are given on the present invention structured as above using the following embodiments.

Embodiments of the present invention will be described below.

[Embodiment 1]

This embodiment gives a detailed description on the element structure of a light emitting element in a light emitting device of the present invention with reference to FIG. 4. Specifically, the element structure in which a low-molecular based compound is used for a layer comprising at least one organic compound will be described.

As described in Embodiment Mode, an anode 401 is formed from a light-shielding metal compound film. The anode 401 in this embodiment is an electrode electrically connected to a TFT 202 as in FIG. 3C, and is formed of TiN by sputtering to a thickness of 110 nm. Sputtering used here can be diode sputtering, ion beam sputtering, opposite target sputtering, or the like.

A layer comprising at least one organic compound 402 is formed on the anode 401. First, a hole injection layer 403 having a function of improving injection of holes from the anode is formed. The hole injection layer 403 in this embodiment is a copper phthalocyanine (Cu—Pc) film with a thickness of 30 nm. Evaporation is used here to form the film.

Next, a hole transporting layer 404 is formed from a material having excellent hole transporting ability. Here, the layer 404 is formed of 4,4'-bis[N-(1-naphthyl)-N-phenyl-amino]-biphenyl (hereinafter referred to as α-NPD) by evaporation to a thickness of 40 nm.

A light emitting layer 405 is formed next. In this embodiment, holes and electrons are re-combined in the light emitting layer 405 to emit light. The light emitting layer 405 is formed by co-evaporation of 4,4'-dicarbazole-biphenyl (hereinafter referred to as CBP) as a hole transporting host material and tris(2-phenylpyridine) iridium (herinafter referred as Ir(ppy)$_3$) that is a luminous organic compound. The thickness of 405 is 30 nm.

Then a blocking layer 406 is formed. The blocking layer 406 is also called as a hole blocking layer and prevents an idle current that does not participate in recombination to flow when holes injected to the light emitting layer 405 accidentally pass through the electron transporting layer and reach the cathode. In this embodiment, bathocuproine (hereinafter referred to as BCP) is deposited into a film by evaporation to a thickness of 10 nm as the blocking layer 406.

Lastly, an electron transporting layer 407 is formed to complete the layer comprising at least one organic compound 402 having a laminate structure. The electron transporting layer 407 is formed of a material capable of accepting electrons and transporting electrons. In this embodiment, the electron transporting layer 407 is formed of tris(8-quinolinolate) aluminum (hereinafter referred to as Alq$_3$) by evaporation to a thickness of 40 nm.

Next, a cathode 408 is formed. In the present invention, the cathode 408 is an electrode that allows light emitted from the layer comprising at least one organic compound 402 to transmit and therefore is formed of a material transmissive of light. The cathode 408 is also an electrode for injecting electrons to the layer comprising at least one organic compound 402 and therefore has to be formed from a material of small work function. In order to make the work function of the cathode small, this embodiment employs a 2 nm thick film of calcium fluoride (CaF) that is fluoride of an alkaline earth metal. On this film, a 20 nm thick film of aluminum (Al) that has high conductivity is layered in order to improve the conductivity of the cathode 408. The cathode 408 thus has a laminate structure.

In this embodiment, a material having small work function and a highly conductive material are layered to enhance the function of a cathode and at the same time the laminate is made as thin as 10 to 30 nm to secure 40% or more of transmittance for the cathode. However, the cathode is not necessarily made thin as long as the material used can provide sufficient function as a cathode and can secure 40% or more of transmittance.

Figure 18A:
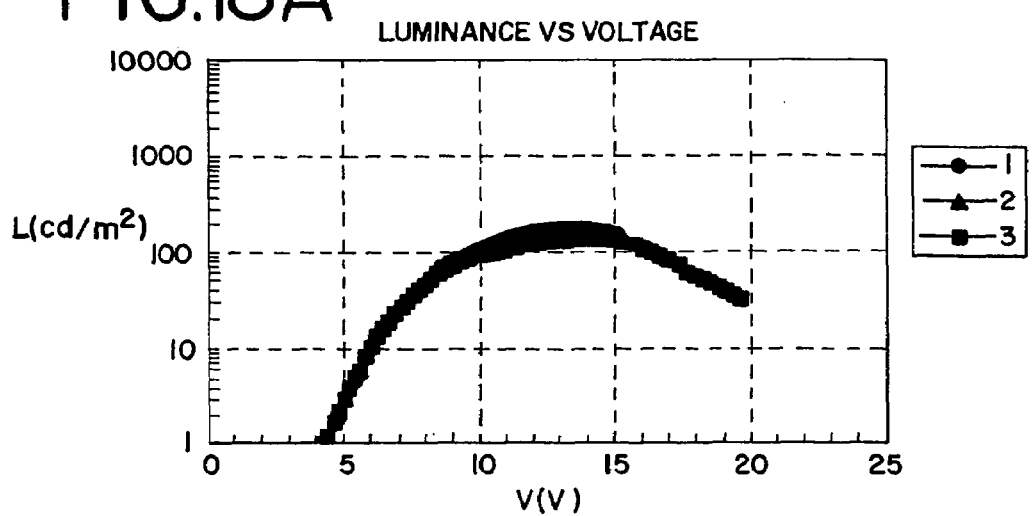
FIGS. 18A and 18B are graphs showing results of measuring element characteristics of a light emitting element of the present invention.
Figure 18B:
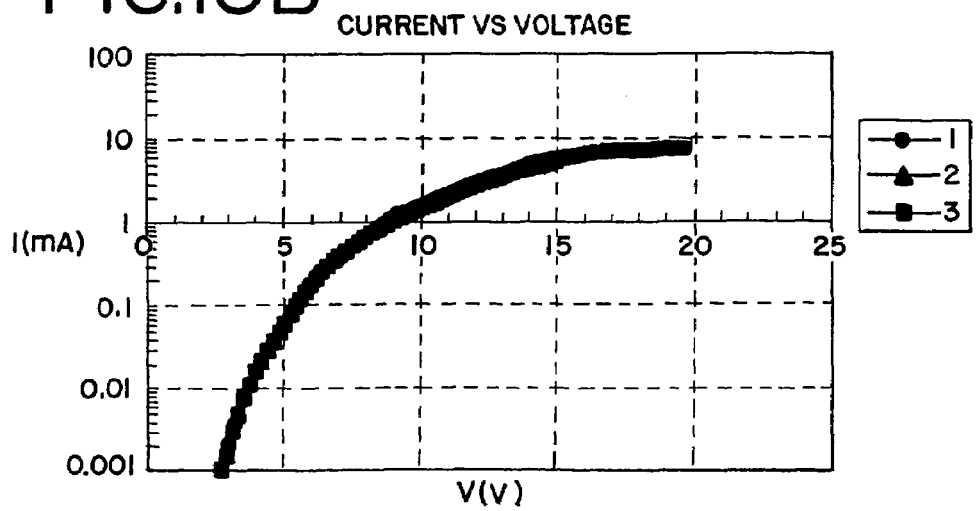

FIGS. 18A and 18B show results of measuring element characteristics of a light emitting element that uses a low-molecular based organic compound for a layer comprising at least one organic compound. The light emitting element has an anode in which a titanium (Ti) film and a film of TiN that is a light-shielding metal compound are layered, a layer comprising at least one organic compound in which a Cu—Pc film, an α-NPD film, and an Alq$_3$ film are layered, and a cathode in which a barium fluoride (BaF$_2$) film and an Al film are layered. The light-shielding metal compound film here is a TiN film subjected to UV ozone treatment. FIG. 18A shows a luminance characteristic of this light emitting element in relation to voltage. FIG. 18B shows a current characteristic of this light emitting element in relation to voltage.

The results in FIGS. 18A and 18B show that the light emitting element that sufficiently functions as carrier injection type element is one in which the drive voltage is as low as 5 V or less at the start of light emission (1 cd/m$^2$), a sufficient amount of current flows upon application of voltage, and TiN is used for its anode.

Figure 19A:
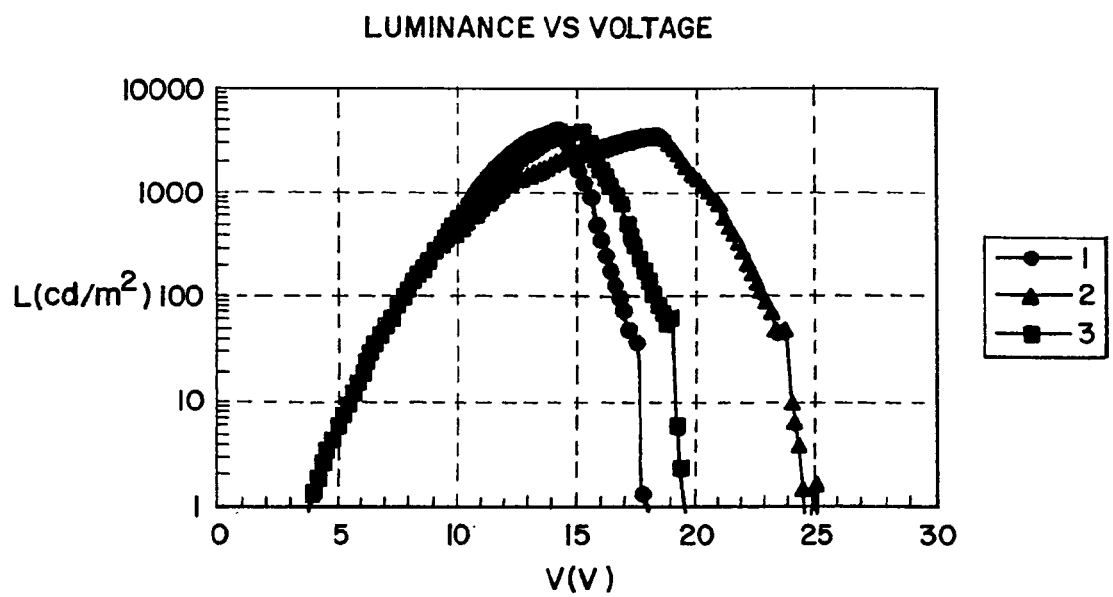
FIGS. 19A and 19B are graphs showing results of measuring element characteristics of a light emitting element of the present invention.
Figure 19B:
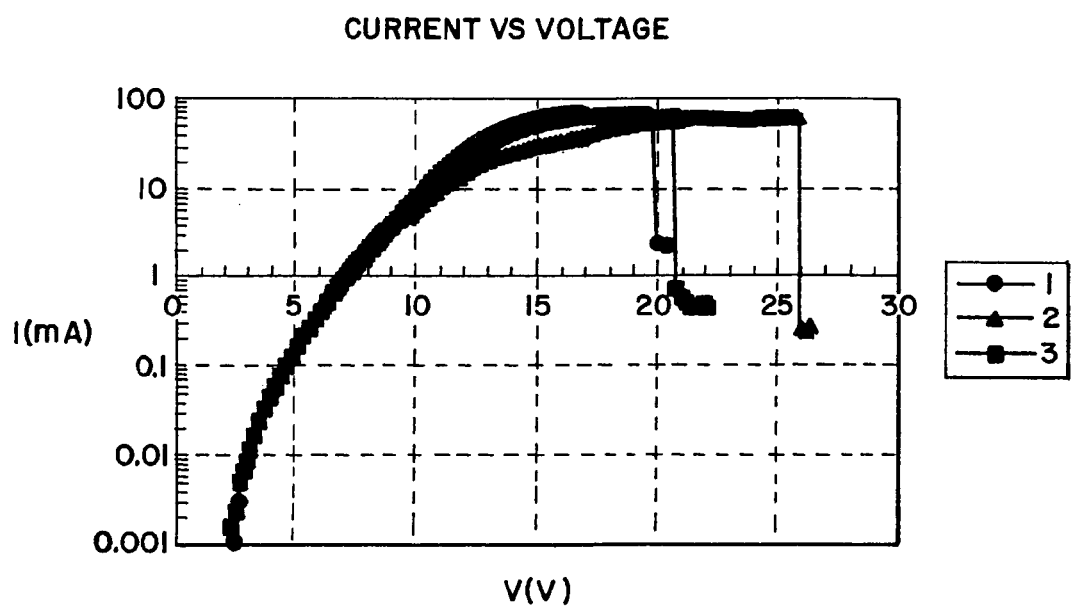

A light emitting element having the same element structure as the one in FIGS. 18A and 18B is prepared. This light emitting element uses TiN for a light-shielding metal compound film to which plasma treatment is performed. FIGS. 19A and 19B show results of measuring element characteristics of this light emitting element. FIG. 19A shows a luminance characteristic of this light emitting element in relation to voltage. FIG. 19B shows a current characteristic of this light emitting element in relation to voltage.

The plasma treatment here employs ICP (inductively coupled plasma). Specifically, in a processing chamber, an antenna coil placed on a quartz plate that is in an upper part of the chamber is connected to an ICP RF power supply through a matching box, and an electrode (lower electrode) opposite to the antenna is also connected to a Bias RF power supply through another matching box. A TiN film that is a light-shielding metal compound film is formed on a surface of a substrate, and the substrate is placed on the lower electrode in the processing chamber for plasma treatment.

The plasma treatment can employ one kind of gas or a combination of plural kinds of gas such as N$_2$, O$_2$, Ar, BCl, and Cl$_2$. For the element shown in FIGS. 19A and 19B, the flow rate of BCl is set to 60 sccm and the flow rate of Cl$_2$ is set to 20 sccm. A 100 W of RF power is given from the Bias RF power supply to the lower electrode and a 450 W of RF power is given to the antennal coil at a pressure of 1.9 Pa to generate plasma and perform plasma treatment on the surface of the TiN film. The length of surface plasma treatment is preferably 5 to 60 seconds. In the case of the light emitting element shown in FIGS. 19A and 19B, the treatment lasts 10 seconds.

FIG. 19A shows a luminance characteristic of the light emitting element in relation to voltage. FIG. 19B shows a current characteristic of the light emitting element in relation to voltage.

In this case, similar to the element subjected to UV ozone treatment, the drive voltage is as low as 5 V or less at the start of light emission (1 cd/m$^2$) and a sufficient amount of current flows upon application of voltage. In addition, the luminance reaches 3000 cd/m$^2$ or more at a drive voltage of 15 V. Accordingly, it is concluded that the element characteristics can be improved even more by plasma treatment.

[Embodiment 2]

In this embodiment, one of the element structures of light emitting devices of the present invention is described in detail with reference to FIG. 5. Especially, the element structure formed by using high-molecular compounds to the layer comprising at least one organic compound is described.

As mentioned in Embodiment Mode, an anode 501 is formed by the metal compound film having light blocking effect.

In this embodiment, the anode 501 is connected electrically to the TFT 202 as shown in FIG. 3C, and is formed by TaN to have a thickness of 110 nm using a sputtering method. As sputtering methods used in this embodiment, two polarity sputtering method, an ion beam sputtering method, an opposite target sputtering method, or the like.

In this embodiment, a layer comprising at least one organic compound 502 formed on the anode 501 has a lamination structure constituted a hole transporting layer 503 and a light emitting layer 504. Further, the layer comprising at least one organic compound 502 is formed by using high molecular organic compounds.

The hole transporting layer 503 can be formed using both of poly (3,4-ethylene dioxythiophene), referred to as PEDOT hereinafter, and polystyrene sulfonic acid, (referred to as PSS hereinafter), which is an acceptor material, or both of polyaniline, referred to as PANI hereinafter, and a camphor sulfonic acid, referred to as CSA hereinafter. The material is made into an aqueous solution since the material is water-soluble, and then the aqueous solution is applied by any coating method so as to form a film. In this embodiment, a film made of PEDOT and PSS is formed to have a thickness of 30 nm as the hole transporting layer 503.

The light emitting layer 504 can be made of a material of poly p-phenylene vinylene, poly p-phenylene, polythiophene, or polyfluorene type.

As the poly p-phenylene vinylene type material, the following can be used: poly(p-phenylene vinylene), referred to as PPV hereinafter, or poly[2-(2'-ethylhexoxy)-5-methoxy-1,4-phenylene vinylene], referred to as MEH-PPV hereinafter, each of which can give orange luminescence; poly[2-(dialkoxyphenyl)-1,4-phenylene vinylene], referred to as ROPh-PPV, which can give green luminescence, or the like.

As the polyparaphenylene type material, the following can be used: poly(2,5-dialkoxy-1,4-phenylene), referred to as RO-PPP hereinafter, poly(2,5-dihexoxy-1,4-phenylene), each of which can give blue luminescence, or the like.

As the polythiophene type material, the following can be used: poly(3-alkylthiophene), referred to as PAT hereinafter, poly(3-hexylthiophene), referred to as PHT hereinafter, poly(3-cyclohexylthiophene), referred to as PCHT hereinafter, poly(3-cyclohexyl-4-methylthiophene), referred to as PCHMT hereinafter, poly(3,4-dicyclohexylthiophene), referred to as PDCHT hereinafter, poly[3-(4-octylphenyl)-thiophene], referred to as POPT hereinafter, or poly[3-(4-octylphenyl)-2,2-bithiophene], referred to as PTOPT hereinafter, each of which can give red luminescence, or the like.

As the polyfluorene type material, the following can be used: poly(9,9-dialkylfluorene), referred to as PDAF hereinafter, or poly(9,9-dioctylfluorene), referred to as PDOF hereinafter, each of which can give blue luminescence, or the like.

The above-mentioned material which can form a light emitting layer is dissolved in an organic solvent, and then the solution is applied by any coating method. Examples of the organic solvent used herein include toluene, benzene, chlorobenzene, dichlorobenzene, chloroform, tetralin, xylene, dichloromethane, cyclohexane, NMP (N-methyl-2-pyrrolidone), dimethylsulfoxide, cyclohexanone, dioxane, and THF (tetrahydrofuran).

In this embodiment, the film made of PPV as a light emitting layer 504 is formed to have a thickness of 80 nm. Consequently, the layer comprising at least one organic compound 502 that has a lamination structure composed of the electron hole transportation layer 503 and the light emitting layer 504 can be obtained.

Next, the cathode 505 is formed. In the present invention, since the light generated at the layer comprising at least one organic compound 502 radiates through the cathode 505, the materials that is a transparent to the light is used to form the cathode 505. Moreover, since the cathode 505 injects electron to the layer comprising at least one organic compound 502, small work function material is needed to form the cathode 505. Then, in this embodiment, the cathode 505 is formed to be a lamination structure in which the cesium (Cs) that is alkaline-earth metals is deposited to have a thickness of 2 nm in order to low the work function, and aluminum with the high conductivity (aluminum) is deposited thereon to have a thickness of 20 nm in order to raise the conductivity of the cathode 505.

In this embodiment, in order to improve the function as a cathode, small work function materials and high conductive materials are laminated to form an ultrathin film having a thickness of 10 to 30 nm to secure 40% or more transparency. However, if the material for forming the cathode has an adequate function as a cathode, and 40% or more transparency, the film thickness is not necessarily to be reduced.

[Embodiment 3]

In forming a element substrate, a method of simultaneously forming, on the same substrate, a pixel portion and TFTs (n-channel TFT and p-channel TFT) of a driver circuit formed in the periphery of the pixel portion and forming a light emitting element which is electrically connected to the TFT at pixel portion are described in detail with reference to FIGS. 6 to 9 in this embodiment. Note that, in this embodiment, light emitting element having the structure described in Embodiment Mode is formed.

First, in this embodiment, a substrate 600 is used, which is made from glass, such as barium borosilicate glass or aluminum borosilicate, represented by such as Corning #7059 glass and #1737. Note that, as the substrate 600, there is not particular limitation if the substrate is transparent to the light, even a quartz substrate can be used. A plastic substrate having heat resistance to a process temperature of this embodiment may also be used.

Then, a base film 601 formed from an insulating film such as a silicon oxide film, a silicon nitride film or a silicon oxynitride film is formed on the substrate 600. In this embodiment, a two-layer structure is used as the base film 601. However, a single-layer film or a lamination structure consisting of two or more layers of the insulating film may be used. As a first layer of the base film 601, a silicon oxynitride film 601a is formed into a thickness of 10 to 200 nm (preferably 50 to 100 nm) using $SiH_4$, $NH_3$, and $N_2O$ as reaction gases by plasma CVD. In this embodiment, the silicon oxynitride film 601a (composition ratio Si=32%, O=27%, N=24% and H=17%) having a film thickness of 50 nm is formed.

Then, as a second layer of the base film 601, a silicon oxynitride film 601b is formed so as to laminate thereon to have a thickness of 50 to 200 nm (preferably 100 to 150 nm) using $SiH_4$ and $N_2O$ as reaction gases by plasma CVD. In this embodiment, the silicon oxynitride film 601b (composition ratio Si=32%, O=59%, N=7% and H=2%) having a film thickness of 100 nm is formed.

Materials the base film 601, single layer or lamination layer of AlMON, AlN, AlMO, and the like can be used.

Subsequently, semiconductor layers 602 to 605 are formed on the base film 601. The semiconductor layers 602 to 605 are formed from a semiconductor film having an amorphous structure by a known method (a sputtering method, an LPCVD method, or a plasma CVD method), and are subjected to a known crystallization process (a laser crystallization method, a thermal crystallization method, or a thermal crystallization method using a catalyst such as nickel). The crystalline semiconductor film thus obtained is patterned into desired shapes to obtain the semiconductor layers. The semiconductor layers 602 to 605 are formed into the thickness of from 25 to 80 nm (preferably 30 to 60 nm). The material of the crystalline semiconductor film is not particularly limited, but it is preferable to form the film using silicon, a silicon germanium ($Si_{1-x}Ge_x$(x=0.0001 to 0.02)) alloy, or the like.

In this embodiment, 55 nm thick amorphous silicon film is formed by plasma CVD, and then, nickel-containing solution is held on the amorphous silicon film. A dehydrogenating process of the amorphous silicon film is performed (500° C. for one hour), and thereafter a thermal crystallization process is performed (550° C. for four hours) thereto. Further, to improve the crystallinity thereof, laser anneal treatment is performed to form the crystalline silicon film. Then, this crystalline silicon film is subjected to a patterning process using a photolithography method, to obtain the semiconductor layers 602 to 605.

Further, before or after the formation of the semiconductor layers 602 to 605, a minute amount of impurity element (boron or phosphorus) may be doped to control a threshold value of the TFT.

Besides, in the case where the crystalline semiconductor film is manufactured by the laser crystal method, a excimer laser, YAG laser, and $YVO_4$ laser of a pulse oscillation type or continuous-wave type gas state laser. In the case where those lasers are used, it is appropriate to use a method in which laser light radiated from a laser oscillator is condensed by an optical system into a linear beam, and is irradiated to the semiconductor film. Although the conditions of the crystallization should be properly selected by an operator, in the case where the exciter laser is used, a pulse oscillation frequency is set as 300 Hz, and a laser energy density is as 100 to 400 mJ/cm² (typically 200 to 300 mJ/cm²). In the case where the YAG laser is used, it is appropriate that the second harmonic is used to set a pulse oscillation frequency as 30 to 300 kHz, and a laser energy density is set as 300 to 600 mJ/cm² (typically, 350 to 500 mJ/cm²). Then, laser light condensed into a linear shape with a width of 100 to 1000 μm, for example, 400 μm is irradiated to the whole surface of the substrate, and an overlapping ratio (overlap ratio) of the linear laser light at this time may be set as 50 to 90%.

A gate insulating film 607 is then formed for covering the semiconductor layers 602 to 605. The gate insulating film 607 is formed from an insulating film containing silicon by plasma CVD or sputtering into a film thickness of from 40 to 150 nm. In the embodiment, the gate insulating film 607 is formed from a silicon oxynitride film into a thickness of 110 nm by plasma CVD (composition ratio Si=32%, O=59%, N=7%, and H=2%). Of course, the gate insulating film 607 is not limited to the silicon oxynitride film, an insulating film containing other silicon may be formed into a single layer of a lamination structure.

Beside, when the silicon oxide film is used, it can be formed by plasma CVD in which TEOS (tetraethyl orthosilicate) and $O_2$ are mixed, with a reaction pressure of 40 Pa, a substrate temperature of from 300 to 400° C., and discharged at a high frequency (13.56 MHz) power density of 0.5 to 0.8 W/cm². Good characteristics as the gate insulating film can be obtained in the silicon oxide film thus manufactured by subsequent thermal annealing at 400 to 500° C.

Then, as shown in FIG. 6A, on the gate insulating film 607, a first conductive film 608 and a second conductive film 609 are formed into lamination to have a film thickness of 20 to 100 nm and 100 to 400 nm, respectively. In this embodiment, the first conductive film 608 made from a TaN film with a film thickness of 30 nm and the second conductive film 609 made from a W film with a film thickness of 370 nm are formed into lamination. The TaN film is formed by sputtering with a Ta target under an atmosphere containing nitrogen. Besides, the W film is formed by the sputtering method with a W target. The W film may be formed by thermal CVD using tungsten hexafluoride ($WF_6$).

Whichever method is used, it is necessary to make the material have low resistance for use as the gate electrode, and it is preferred that the resistivity of the W film is set to less than or equal to 20 μΩcm. By making the crystal grains large, it is possible to make the W film have lower resistivity. However, in the case where many impurity elements such as oxygen are contained within the W film, crystallization is inhibited and the resistance becomes higher. Therefore, in this example, by forming the W film having high purity by sputtering using a target having a purity of 99.9999%, and in addition, by taking sufficient consideration to prevent impurities within the gas phase from mixing therein during the film formation, a resistivity of from 9 to 20 μΩcm can be realized.

Note that, in this embodiment, the first conductive film 608 is made of TaN, and the second conductive film 609 is made of W, but the material is not particularly limited thereto, and either film may be formed of an element selected from Ta, W, Ti, Mo, Al, Cu, Cr and Nd or an alloy material or a compound material containing the above element as its main ingredient. Besides, a semiconductor film typified by a polycrystalline silicon film doped with an impurity element such as phosphorus may be used. Also, an alloy containing Ag, Pd, Cu can be used.

Besides, any combination may be employed such as a combination in which the first conductive film 608 is formed of tantalum (Ta) and the second conductive film 609 is formed of W, a combination in which the first conductive film 608 is formed of titanium nitride (TiN) and the second conductive film 609 is formed of W, a combination in which the first conductive film 608 is formed of tantalum nitride (TaN) and the second conductive film 609 is formed of Al, or a combination in which the first conductive film 608 is formed of tantalum nitride (TaN) and the second conductive film 609 is formed of Cu, or a combination in which the first conductive film 608 is formed of W, Mo, or the combination of W and Mo and the second conductive film 609 is formed of Al and Si or Al and Ti or Al and Sc or Al and Nd, further, the third conductive film (not shown) is formed from Ti, TiN or the combination of Ti and TiN.

Next, masks 610 to 613 made of resist are formed using a photolithography method, and a first etching process is performed in order to form electrodes and wirings as shown in FIG. 6B. This first etching process is performed with the first and second etching conditions. In this embodiment, as the first etching conditions, an ICP (inductively coupled plasma) etching method is used, a gas mixture of $CF_4$, $Cl_2$ and $O_2$ is used as an etching gas, the gas flow rate is set to 25/25/10 sccm, and plasma is generated by applying a 500 W RF (13.56 MHz) power to a coil shape electrode under 1 Pa. A dry etching device with ICP (Model E645-□ICP) produced by Matsushita Electric Industrial Co. Ltd. is used here. A 150 W RF (13.56 MHz) power is also applied to the substrate side (test piece stage) to effectively apply a negative self-bias voltage.

The W film is etched with the first etching conditions, and the end portion of the first conductive layer is formed into a tapered shape. In the first etching conditions, the etching rate for W is 200.39 nm/min, the etching rate for TaN is 80.32 nm/min, and the selectivity of W to TaN is about 2.5. Further, the taper angle of W is about 26° with the first etching conditions.

Thereafter, as shown in FIG. 6B, the first etching conditions are changed into the second etching conditions without removing the masks 610 to 613 made of resist, a mixed gas of $CF_4$ and $Cl_2$ is used as an etching gas, the gas flow rate is set to 30/30 sccm, and plasma is generated by applying a 500 W RF (13.56 MHz) power to a coil shape electrode under 1 Pa to thereby perform etching for about 15 seconds. A 20 W RF (13.56 MHz) power is also applied to the substrate side (test piece stage) to effectively a negative self-bias voltage. The W film and the TaN film are both etched on the same order with the second etching conditions in which $CF_4$ and $Cl_2$ are mixed.

In the second etching conditions, the etching rate for W is 58.97 nm/min, and the etching rate for TaN is 66.43 nm/min. Note that, the etching time may be increased by approximately 10 to 20% in order to perform etching without any residue on the gate insulating film.

In the first etching process, the end portions of the first and second conductive layers are formed to have a tapered shape due to the effect of the bias voltage applied to the substrate side by adopting masks of resist with a suitable shape. The angle of the tapered portions may be set to 15° to 45°. Thus, first shape conductive layers 615 to 618 (first conductive layers 615a to 618a and second conductive layers 615b to 618b) constituted of the first conductive layers and the second conductive layers are formed by the first etching process. Reference numeral 620 denotes a gate insulating film, and regions of the gate insulating film which are not covered by the first shape conductive layers 615 to 618 are made thinner by approximately 20 to 50 nm by etching.

Then, a first doping process is performed to add an impurity element for imparting an n-type conductivity to the semiconductor layer without removing the mask made of resist (FIG. 6B). Doping may be carried out by an ion doping method or an ion injecting method. The condition of the ion doping method is that a dosage is $1 \times 10^{13}$ to $5 \times 10^{15}$ atoms/$cm^2$, and an acceleration voltage is 60 to 100 keV. In this embodiment, the dosage is $1.5 \times 10^{15}$ atoms/$cm^2$ and the acceleration voltage is 80 keV.

As the impurity element for imparting the n-type conductivity, an element which belongs to group 15 of the periodic table, typically phosphorus (P) or arsenic (As) is used, and phosphorus is used here. In this case, the conductive layers 615 to 618 become masks to the impurity element for imparting the n-type conductivity, and high concentration impurity regions 621 to 624 are formed in a self-aligning manner. The impurity element for imparting the n-type conductivity is added to the high concentration impurity regions 621 to 624 in the concentration range of $1 \times 10^{20}$ to $1 \times 10^{21}$ atoms/$cm^3$.

Thereafter, the second etching process is performed without removing the masks made of resist as shown in FIG. 6C. The second etching process is performed by third or fourth etching condition. Here, a mixed gas of $CF_4$, $Cl_2$ is used as an etching gas, the gas flow rate is set to 30/30 sccm, and plasma is generated by applying a 500 W RF (13.56 MHz) power to a coil shape electrode under 1 Pa to thereby perform etching for about 60 seconds. A 20 W RF (13.56 MHz) power is also applied to the substrate side (test piece stage) to effectively apply a negative self-bias voltage. The W film and the TaN film are both etched on the same order with the third etching conditions in which $CF_4$ and $Cl_2$ are mixed.

In the second etching process, the etching rate for W is 58.97 nm/min, the etching rate for TaN is 66.43. Note that, the etching time may be increased by approximately 10 to 20% in order to perform etching without any residue on the gate insulating film.

Thereafter, as shown in FIG. 6C, the third etching conditions are changed into the fourth etching conditions. Without removing the masks 610 to 613 made of resist, a mixed gas of $CF_4$, $Cl_2$ and $O_2$ is used as an etching gas, the gas flow rate is set to 20/20/20 sccm, and plasma is generated by applying a 500 W RF (13.56 MHz) power to a coil shape electrode under 1 Pa to thereby perform etching for about 20 seconds. A 20 W RF (13.56 MHz) power is also applied to the substrate side (test piece stage) to effectively apply a negative self-bias voltage.

In the fourth etching conditions, etching rate for TaN is 14.83 nm/min. Therefore, the W film etched selectively. According to the fourth etching process, the second conductive layers 626 to 629 (first conductive layers 626a to 629a and second conductive layers 626b to 629b) are formed.

Next, a second doping process is performed as shown in FIG. 7A. First conductive layers 626a to 629a and second conductive layers 626b to 629b are used as masks to an impurity element, and doping is performed such that the impurity element is added to the semiconductor layer below the tapered portions of the first conductive layers. In this embodiment, phosphorus (P) is used as the impurity element, and plasma doping is performed with the dosage of $1.5 \times 10^{14}$ atoms/$cm^2$, current density of 0.5 µA and the acceleration voltage of 90 keV.

Thus, low concentration impurity regions 631a to 634a, which overlap with the first conductive layers and low concentration impurity regions 631b to 634b, which do not overlap with the first conductive layers are formed in a self-aligning manner. The concentration of phosphorus (P) in the low concentration impurity regions 631 to 634 is $1 \times 10^{17}$ to $5 \times 10^{18}$ atoms/$cm^3$. Further, the impurity element is added to the high concentration impurity regions 621 to 624 and the high concentration impurity regions 635 to 638 are formed.

New masks are formed from resist (639 and 640), and a third doping process is performed. Impurity regions 641a, 641b, 642a, and 642b, to which an impurity element is added that imparts the opposite conductivity type (p-type) from the single conductivity type (n-type) are formed to the semiconductor layers, which become active layers of p-channel TFTs, by the third doping process. (See FIG. 7B.) The first conductive layers 627a and the second conductive layer 627b are used as masks against the impurity element, the impurity element imparting p-type conductivity is added, and the impurity regions are formed in a self-aligning manner.

The impurity regions 641a, 641b, 642a, and 642b are formed in this embodiment by ion doping using diborane ($B_2H_6$). Phosphorous is added to the impurity regions 641a, 642a and impurity regions 642b, 642b in differing concentrations, respectively, by the first doping process and by the second doping process. However, doping is performed such that the concentration of the impurity element which imparts p-type conductivity to each of the regions becomes from $2 \times 10^{20}$ to $2 \times 10^{21}$ atoms/$cm^3$, and therefore no problems will develop with the regions functioning as source regions and drain regions of p-channel TFTs.

The resist masks 639 and 640 are removed next, and a first interlayer insulating film 643 is formed as shown in FIG. 7C. In this embodiment, as the first inter layer insulating film 643, the lamination film is formed from the first insulating film 643a containing silicon and nitride and the second insulating film 643b containing silicon and oxygen.

An insulting film containing silicon is formed having a thickness of 100 to 200 nm, using plasma CVD or sputtering, as the first interlayer insulating film 643a. A silicon oxynitride film is formed with a film thickness of 100 nm by plasma CVD in Embodiment 3. The first interlayer insulating film 643a is of course not limited to the silicon oxynitride film, and other insulating films containing silicon may be used in a single layer or a lamination structure.

Next, a process for activating the impurity elements added to each of the semiconductor layers is performed. Thermal annealing using an annealing furnace is performed for the activation process. Thermal annealing may be performed in a nitrogen atmosphere having an oxygen concentration of 1 ppm or less, preferably 0.1 ppm or less, at 400 to 700° C., typically between 500 and 550° C. The activation process is performed in Embodiment 3 by heat treatment at 550° C. for four hours. Note that, in addition to thermal annealing, laser annealing and rapid thermal annealing (RTA) can also be applied.

Note also that, in Embodiment 3, nickel used as a catalyst during crystallization is gettered into the impurity regions 635, 637, and 638 containing phosphorous at a high concentration at the same time as the above activation process is performed. The nickel concentration within the semiconductor layers that mainly become channel forming regions is thus reduced. The value of the off current is reduced for TFTs having channel forming regions thus formed, and a high electric field effect mobility is obtained because of the good crystallinity. Thus, good properties can be achieved.

Further, the activation process may also be performed before forming the first interlayer insulating film. However, when using a wiring material which is weak with respect to heat, it is preferable to perform the activation process after forming the interlayer insulating film (insulating film containing silicon as its main constituent, silicon nitride film, for example) in order to protect the wirings and the like, as in Embodiment 3.

The doping process may be performed, and the first interlayer insulating film may be formed after performing the activation process.

In addition, heat treatment is performed for 1 to 12 hours at 300 to 550° C. in an atmosphere containing hydrogen of 3 to 100%, performing hydrogenation of the semiconductor layers. Heat treatment is performed for one hour at 410° C. in an atmosphere containing approximately 3% hydrogen in Embodiment 3. This process is one for terminating dangling bonds of the semiconductor layers by hydrogen contained in the interlayer insulating film. Plasma hydrogenation (using hydrogen excited by plasma) may be performed as another means of hydrogenation.

Further, when using a laser annealing method as the activation process, it is preferable to irradiate laser light such as that from an excimer laser or a YAG laser after performing the above hydrogenation process.

A second interlayer insulating film 643b is formed next on the first interlayer insulating film 643a from insulating film containing silicon with a thickness of 1 to 2 μm by plasma CVD or sputtering. An oxynitride film having a film thickness of 1.2 μm is formed in Embodiment 3. Of course, the second insulating film 643b is not limited to the above mentioned film, an insulating film containing other silicon may be formed into a single layer or a lamination structure.

Then the first interlayer insulating film 643 made from first insulating film 643a and second insulating film 643b can be formed.

Next, patterning is performed in order to form contact holes for reaching the impurity regions 635, 636, 637, and 638.

In addition, the first insulating film 643a and the second insulating film 643b are insulating film contained silicon formed plasma CVD, so that dry etching method or wet etching method can be used for forming a contact hole. However, in this embodiment, wet etching method is used for etching the first insulating film, and the dry etching method is used for etching the second insulating film.

First, the second insulating film 643b is etched. Here, a mixed solution (Stella chemifa Inc., brand name LAL 500) contained 7.13% of hydrogen ammonium fluoride ($NH_4HF_2$) and 15.4% of ammonium fluoride ($NH_4F$) is used as an etchant to conduct a wet etching at 20° C.

Next, the first insulating film 643a is etched. $CHF_4$ is used as an etching gas, and gas flow rates are set to 35 sccm. An 800 W RF electric power is applied at a pressure of 7.3 Pa, and dry etching is performed.

Figure 8A:
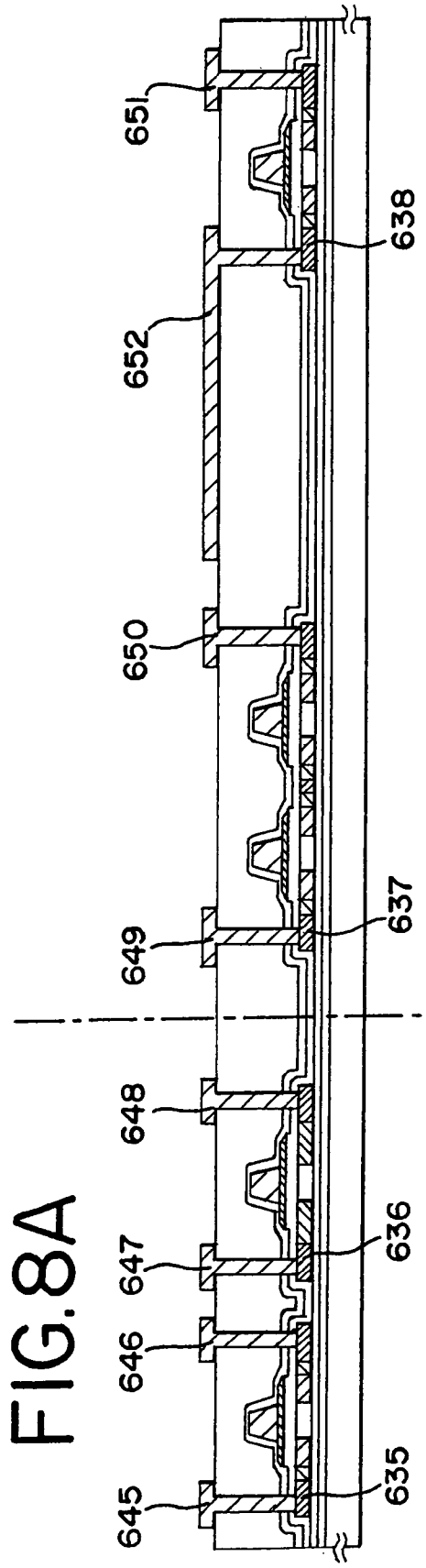
FIGS. 8A and 8B are diagrams illustrating a process of manufacturing a light emitting device in accordance with the present invention.

Wirings 645 to 651 and an anode 652 are formed that connect electrically with high concentration impurity regions 635, 636, 637, and 638 respectively. In this embodiment, as materials for forming wirings 645 to 651 and the anode 652, conductive materials having light blocking effect are used. Specifically, a conductive nitride, an oxide, a carbide, a boride, and a silicide that are composed of elements of fourth, fifth, or sixth group of the periodic system can be used. However, wirings 645 to 651 and the anode 652 are patterned to be formed having a thickness of 500 nm by using titanium nitride (TiN) (FIG. 8A).

As the etching conditions of this embodiment, a mixed gas of $CF_4$ and $Cl_2$ is used as an etching gas, the gas flow rate is set to 40/40 sccm, and plasma is generated by applying a 500 W RF (13.56 MHz) power to a coil shape electrode under 1.2 Pa to thereby perform etching for about 30 seconds. A 100 W RF (13.56 MHz) power is also applied to the substrate side (test piece stage) to effectively a negative self-bias voltage.

In this embodiment, the anode 652 is formed simultaneously with wiring formation, and to serve a function as a wiring of high concentration impurity region 638.

The insulating film is formed in 1 μm thickness. As material forming an insulating film, a film containing silicon oxide is used in this embodiment. Another films such as insulating film containing silicon nitride, or silicon oxide nitride, the organic resin film, polyimide, polyamide, acrylic (photosensitive acrylic is included), BCB (benzocyclobutene), or the like may also be used.

Figure 8B:
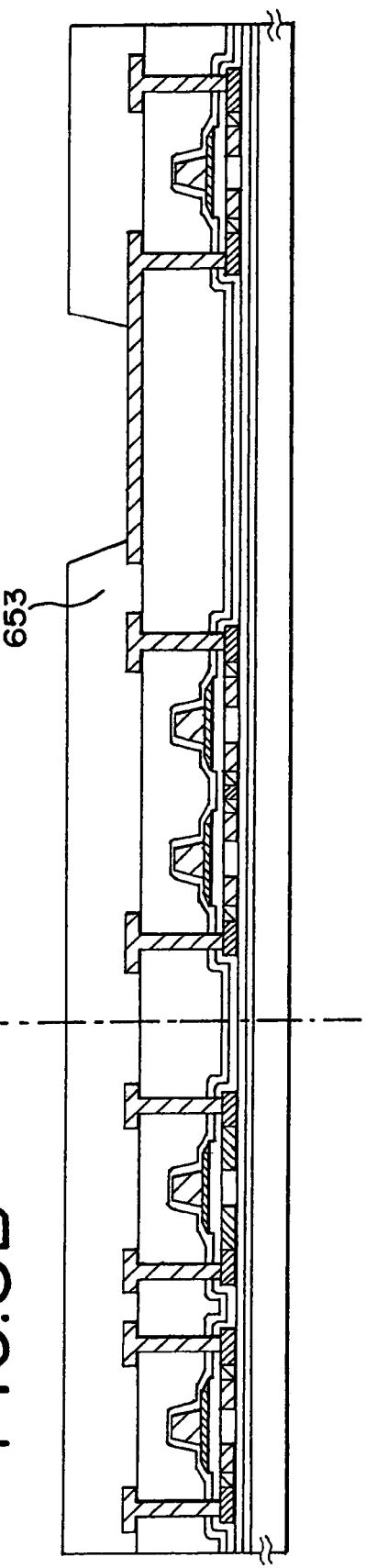

An opening portion is formed to correspond to the cathode 652 of this insulating film, and the insulating layer 653 is formed (FIG. 8B).

Specifically, the insulating film 653 is formed by that the insulating film is formed in 1 μm thick using a photosensitive acrylic, and after that it is patterned using photolithography method and is performed etching treatment.

On the exposed anode 652 at the opening portion in the insulating layer 653, a layer comprising at least one organic compound 654 is formed by evaporation method (FIG. 9A). In this embodiment, the state of forming one kind of layers comprising organic compounds that are constituted organic compounds emitting three kinds of luminescence, red, green, and blue is illustrated. The combination of the organic compounds that form three kinds of organic compounds layer is described with reference to FIGS. 10A to 10D.

A light emitting element shown in FIG. 10A is constituted an anode 1001, a layer comprising at least one organic compound 1002, and a cathode 1003. The layer comprising at least one organic compound 1002 has a lamination structure constituted a hole transporting layer 1004, a light emitting layer 1005, and an electron transporting layer 1006. As for the material that constitute red luminescent light emitting element and the thickness are illustrated in FIG. 10B, as for the material that constitute green luminescent light emitting element and the thickness are illustrated in FIG. 10C, and as for the material that constitute blue luminescent light emitting element and the thickness are illustrated in FIG. 10D respectively.

First, a layer comprising at least one organic compound emitting red light is formed. Specifically, a 4,4'-bis[N-(1-naphthyl)-N-phenyl-amino]-biphenyl (hereinafter referred to as the α-NPD) as a hole transporting organic compound is formed into a hole transporting layer 1004 in a 40 nm film thickness. A 2, 3, 7, 8, 12, 13, 17, 18-octaethyl-21H, 23H-porphyrin-platinum (hereinafter referred to as the PtOEP) as a luminescent organic compound is co-deposited to form the light emitting layer 1005 with organic compounds (hereinafter referred to as the host materials) a 4,4'-dicarbazol-biphenyl (hereinafter referred to as the CBP) to serve as the host in a 30 nm film thickness. A basocuproin (hereinafter referred to as the BCP) as a blocking organic compound is formed into a blocking layer 1006 in a 10 nm film thickness. A tris(8-quinolinolatoA) aluminum (hereinafter referred to as the Alq$_3$) as an electron transporting organic compound is formed into the electron transporting layer 1007 in a 40 nm film thickness. Thereby, a red luminescent layer comprising at least one organic compound can be formed.

Although the case of forming a red luminescent layer comprising at least one organic compound using 5 kinds of organic compounds with different functions is explained here, the present invention is not limited thereto, and known materials can be used as the organic compound showing the red luminescence.

A green luminescent layer comprising at least one organic compound is formed. Specifically, an α-NPD as a hole transporting organic compound is formed into the hole transporting layer 1004 in a 40 nm film thickness. The light emitting layer 1005 is formed by that a CBP used as a hole transmitting host material is co-deposited with a tris(2-phenyl pyridine) iridium (Ir(ppy)$_3$) in a 30 nm film thickness. A BCP as a blocking organic compound is formed into the blocking layer 1006 in a 10 nm film thickness. An Alq$_3$ as an electron transporting organic compound is formed into the electron transporting layer 1007 in a 40 nm film thickness. Thereby, a green luminescent layer comprising at least one organic compound can be formed.

Although the case of forming a green luminescent layer comprising at least one organic compound using 4 kinds of organic compounds with different functions is explained here, the present invention is not limited thereto, and known materials can be used as the organic compound showing the green luminescence.

A blue luminescent layer comprising at least one organic compound is formed. Specifically, an α-NPD as a luminescent organic compound and a hole transporting organic compound is formed into the light emitting layer 1005 in a 40 nm film thickness. A BCP as a blocking organic compound is formed into the blocking layer 1006 in a 10 nm film thickness. An Alq$_3$ as an electron transporting organic compound is formed into the electron transporting layer 1007 in a 40 nm film thickness. Thereby, a blue luminescent layer comprising at least one organic compound can be formed.

Although the case of forming a blue luminescent layer comprising at least one organic compound using 3 kinds of organic compounds with different functions is explained here, the present invention is not limited thereto, and known materials can be used as the organic compound showing the blue light emission.

By forming the above-mentioned organic compounds on the anode, a layer comprising at least one organic compound emitting the red luminescence, the green luminescence and the blue luminescence can be formed in the pixel portion.

As shown in FIG. 9B, the cathode 655 is formed to cover the layer comprising at least one organic compound 654 and the insulating layer 653. In this embodiment, the cathode 655 is made from conductive film that is a transparent to the light. Specifically, it is preferable that the cathode 655 is formed by small work function materials in order to improve the electron injection from the cathode 655. For example, materials can be selected from alkaline metal or alkaline-earth metal, combinations of alkaline metal or alkaline-earth metal with another materials, or alloys of another materials in alkaline metal or alkaline-earth metal (for example, Al: Mg alloy, Mg: In alloy, or the like). In this embodiment, the cathode 655 is formed to have a lamination structure in which calcium fluoride (CaF) that is a nitride of alkaline-earth metal and aluminum that has higher conductivity or silver is deposited thereon.

In this embodiment, since the light generated at the light emitting element radiates through the cathode 655, the cathode needs to be a transparent to the light. Therefore, CaF film is formed to contact with the layer comprising at least one organic compound 654 having a thickness of 2 nm, and an aluminum film or a silver film is formed thereon having a thickness of 20 nm.

Thus, the cathode is formed by ultrathin film, thereby the electrode having light transparency can be formed. The cathode 655 can be formed by another known material only in cases in which the material is a small work function material and is a conductive film that is transparent to the light.

As shown in FIG. 9B, an element substrate having a light emitting element 656 that is composed of the anode 652 connected electrically to the current control TFT 704, the insulating layer 653 formed between the cathode 652 and the anode that is adjacent to the anode 652 (not illustrated), the layer comprising at least one organic compound 654 formed on the anode 652, the cathode 655 formed on the layer comprising at least one organic compound 654 and the insulating layer 653 can be formed.

Note that, in the process of manufacturing the light emitting device in this embodiment, although the source signal lines are formed by materials which form the gate electrodes, and although the gate signal lines are formed by wiring materials which forms the source and drain electrodes, with relation to the circuit structure and process, other materials may also be used.

Further, a driver circuit 705 having an n-channel TFT 701 and a p-channel TFT 702, and a pixel portion 706 having a switching TFT 703 and a current control TFT 704 can be formed on the same substrate.

The n-channel TFT 701 of the driver circuit 705 has the channel forming region 501, the low concentration impurity region 631 (GOLD region) which overlaps with the first conductive layer 626a forming a portion of the gate electrode, and the high concentration impurity region 635 which functions as a source region or a drain region. The p-channel TFT 702 has the channel forming region 502, and the impurity regions 641 and 642 that function as source regions or drain regions.

The switching TFT 703 of the pixel portion 706 has the channel forming region 503, the low concentration impurity region 633*a* (LDD region) which overlap with the first conductive layer 628*a* forming the gate electrode, the low concentration impurity region 633*b* (LDD region) which does not overlap with the first conductive layer 628*a*, and the high concentration impurity region 637 which functions as a source region or a drain region.

The current control TFT 704 of the pixel portion 706 has the channel forming region 504, the low concentration impurity region 634*a* (LDD region) which overlap with the first conductive layer 629*a*, the low concentration impurity region 634*b* (LDD region) which does not overlap with the first conductive layer 628*a*, and the high concentration impurity region 638 which function as source regions or drain regions.

In this embodiment, the driving voltage of a TFT is 1.2 to 10 V, preferably 2.5 to 5.5 V.

When the display of the pixel portion is active (case of the moving picture display), a background is displayed by pixels in which the light emitting elements emit light and a character is displayed by pixels in which the light emitting elements do not emit light. However, in the case where the moving picture display of the pixel portion is still for a certain period or more (referred to as a standby time in the present specification), for the purpose of saving electric power, it is appropriate that a display method is changed (inverted). Specifically, a character is displayed by pixels in which light emitting elements emit light (also called a character display), and a background is displayed by pixels in which light emitting elements do not emit light (also called a background display).

Figure 11A:
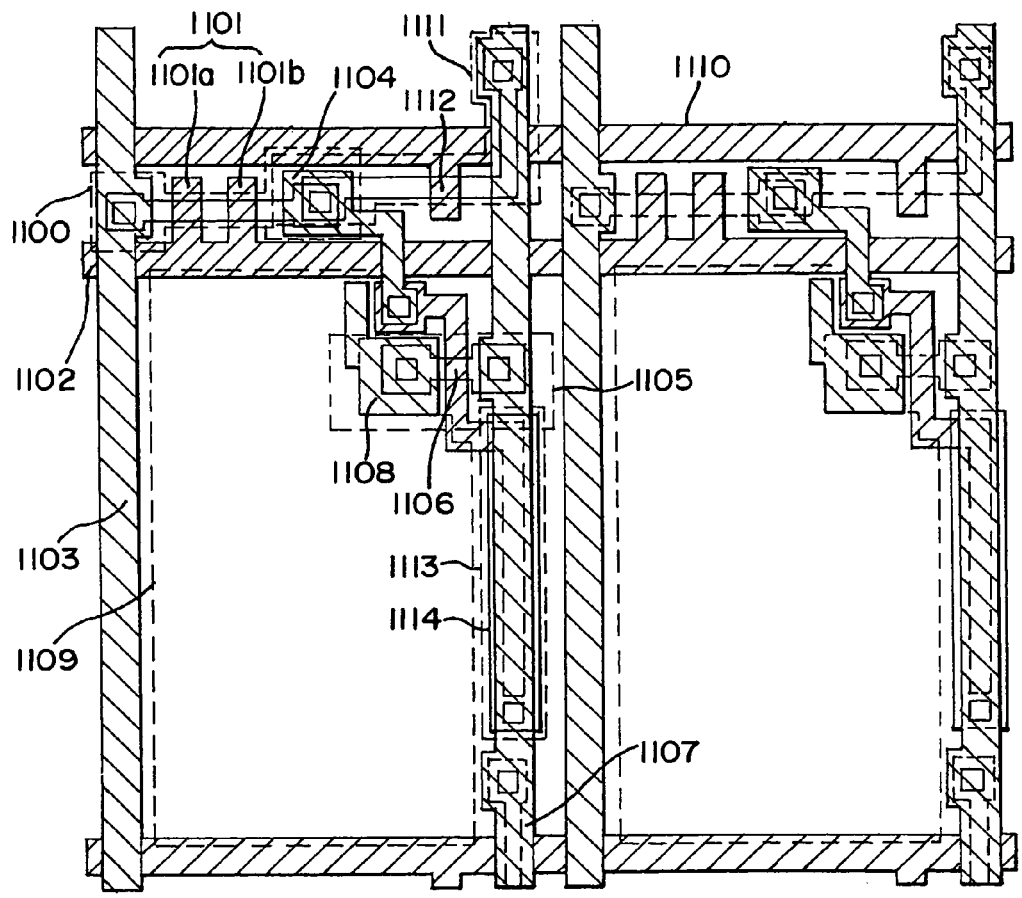
FIGS. 11A and 11B are top views of a pixel portion of a light emitting device.
Figure 11B:
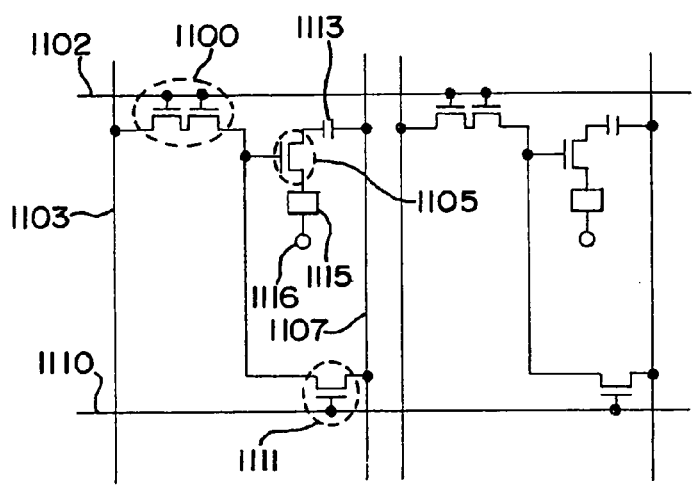

A detailed top surface structure of a pixel portion is shown in FIG. 11A, and a circuit diagram thereof is shown in FIG. 11B. FIGS. 11A and 11B denoted by a same reference numerals.

In FIGS. 11A and 11B, a switching TFT 1100 provided on a substrate is formed by using the switching TFT (n-channel type) TFT 703 of FIG. 9B. Therefore, an explanation of the switching (n-channel type) TFT 703 may be referred for an explanation of the structure. Further, a wiring indicated by reference numeral 1102 is a gate wiring for electrically connecting with gate electrodes 1101 (1101*a* and 1101*b*) of the switching TFT 1100.

Note that, in this embodiment, a double gate structure is adopted, in which two channel forming regions are formed, but a single gate structure, in which one channel forming region is formed, or a triple gate structure, in which three channel forming regions are formed, may also be adopted.

Further, a source of the switching TFT 1100 is connected to a source wiring 1103, and a drain thereof is connected to a drain wiring 1104. The drain wiring 1104 is electrically connected with a gate electrode 1106 of a current control TFT 1105. Note that the current control TFT 1105 is formed by using the current control (n-channel type) TFT 704 of FIG. 9B. Therefore, an explanation of the current control (n-channel type) TFT 704 may be referred for an explanation of the structure. Note that, although the single gate structure is adopted in this embodiment, the double gate structure or the triple gate structure may also be adopted.

Further, a source of the current control TFT 1105 is electrically connected with a current supply line 1107, and a drain thereof is electrically connected with a drain wiring 1108. Besides, the drain wiring 1108 is electrically connected with a cathode 1109 indicated by a dotted line.

A wiring indicated by reference numeral 1110 is a gate wiring connected with the gate electrode 1112 of the erasing TFT 1111. Further, a source of the erasing TFT 1111 is electrically connected to the current supply line 1107, and a drain thereof is electrically connected to the drain wiring 1104.

The erasing TFT 1111 is formed like a current controlling TFT (n-channel type) 704 in FIG. 9B. Therefore, an explanation of the structure is referred to that of the current controlling TFT (n-channel type) 704. In this embodiment, a single gate structure is described though, a double gate structure or a triple gate structure can be used.

At this time, a storage capacitor (condenser) is formed in a region indicated by reference numeral 1113. The capacitor 1113 is formed by a semiconductor film 1014 electrically connected with the current supply line 1107, an insulating film (not shown) of the same layer as a gate insulating film, and the gate electrode 1006. Further, a capacitor formed by the gate electrode 1106, the same layer (not shown) as a first interlayer insulating film, and the current supply line 1107 may be used as a storage capacitor.

The light emitting element 1115 shown in circuit diagram in FIG. 11B is composed of the cathode 1109, a layer comprising at least one organic compound (not illustrated) formed on the cathode 1109, and an anode (not illustrated) formed on the layer comprising at least one organic compound. In the present invention, the cathode 1109 is connected with a source region and a drain region of the current controlling TFT 1105.

A counter potential is supplied to the anode of the light emitting element 1115. In addition, the power source potential is supplied to the power supply line V. A potential difference between the counter potential and the power source potential is always maintained at such a level that causes the light emitting element to emit light when the power source potential is applied to the pixel electrode. The power source potential and the counter potential are supplied to the light emitting device of the present invention by means of a power source provided by an externally-attached IC chip or the like. In the present specification, the power source supplying a counter potential is referred to as the counter power source 1116.

[Embodiment 4]

Referring to FIG. 12, the external appearance of an active matrix type light emitting device of the present invention will be described in this embodiment. FIG. 12A is a top view of the luminescent device, and FIG. 12B is a sectional view taken on line A–A' of FIG. 12A. Reference number 1201 represents a source side driving circuit, which is shown by a dotted line; 1202, a pixel section; 1203, a gate side driving circuit; 1204, a sealing substrate; and 1205, a sealant. A space is surrounded by the sealant 1205.

Reference number 1208 represents an interconnection for transmitting signals inputted to the source signal line driving circuit 1201 and the gate signal line driving circuit 1203. The interconnection 1208 receives video signals or clock signals from a flexible print circuit (FPC) 1209, which will be an external input terminal. Only the FPC is illustrated, but a printed wiring board (PWB) may be attached to this FPC. The light emitting device referred to in the present specification may be the body of the light emitting device, or a product wherein an FPC or a PWB is attached to the body.

The following will describe a sectional structure, referring to FIG. 12B. The driving circuits and the pixel section are formed on the substrate 1210, but the gate side driving circuit 1203 as one of the driving circuits and the pixel section 1202 are shown in FIG. 12B.

In the gate side driving circuit 1203, a CMOS circuit wherein an n-channel type TFT 1213 and a p-channel type TFT 1214 are combined is formed. The TFTs constituting the driving circuit may be composed of known CMOS circuits, PMOS circuits or NMOS circuits. In this embodiment, a driver-integrated type, wherein the driving circuit is formed on the substrate, is illustrated, but the driver-integrated type may not necessarily be adopted. The driver may be fitted not to the substrate but to the outside.

The pixel section 1202 is composed of plural pixels including a current-controlling TFT 1211 and an anode 1212 electrically connected to the drain of the TFT 1211.

On the both sides of the anode 1212, insulating film 1213 are formed, and a layer comprising at least one organic compound 1214 is formed on the anode 1212. Furthermore, a cathode 1216 is formed on the layer comprising at least one organic compound 1214. In this way, a light emitting element 1218 composed of the anode 1212, the layer comprising at least one organic compound 1214 and the cathode 1216 is formed.

The cathode 1216 also functions as an interconnection common to all of the pixels, and is electrically connected through the interconnection 1208 to the FPC 1209.

In order to seal the light emitting element 1218 formed on the substrate 1210, the sealing substrate 1204 is adhered with the sealant 1205. A spacer made of a resin film may be set up to keep a given interval between the sealing substrate 1204 and the light emitting element 1218. An inert gas such as nitrogen is filled into the space 1207 inside the sealant 1205. As the sealant 1205, an epoxy resin is preferably used. The sealant 1205 is desirably made of a material through which water content or oxygen is transmitted as slightly as possible. Furthermore, it is allowable to incorporate a material having moisture absorption effect into the space 1207.

In this embodiment, as the material making the sealing substrate 1204, there may be used a glass substrate, a quartz substrate, or a plastic substrate made of fiber glass-reinforced plastic (FRP), polyvinyl fluoride (PVF), mylar, polyester or polyacrylic resin. After the adhesion of the sealing substrate 1204 to the substrate 1210 with the sealant 1205, a sealant is applied so as to cover the side faces (exposure faces).

As described above, the light emitting element is airtightly put into the space 1207, so that the light emitting element can be completely shut out from the outside and materials promoting deterioration of the layer comprising at least one organic compound, such as water content and oxygen, can be prevented from invading this layer from the outside. Consequently, the light emitting device can be made highly reliable.

The structure of this embodiment may be freely combined with the structure of Embodiments 1 to 3.

[Embodiment 5]

Embodiments 1 to 4 describe an active matrix type light emitting device having a top gate TFT. However, the TFT structure of the present invention is not limited thereto and bottom gate TFTs (typically reverse stagger TFTs) may also be used in carrying out the present invention as shown in FIG. 13. The reverse stagger TFTs may be formed by any method.

Figure 13A:
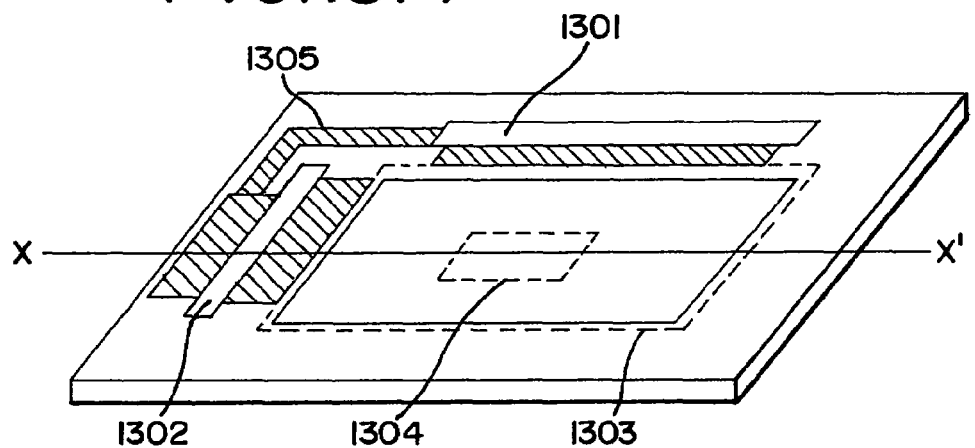
FIGS. 13A and 13B are diagrams illustrating the structure of a reverse stagger TFT.
Figure 13B:
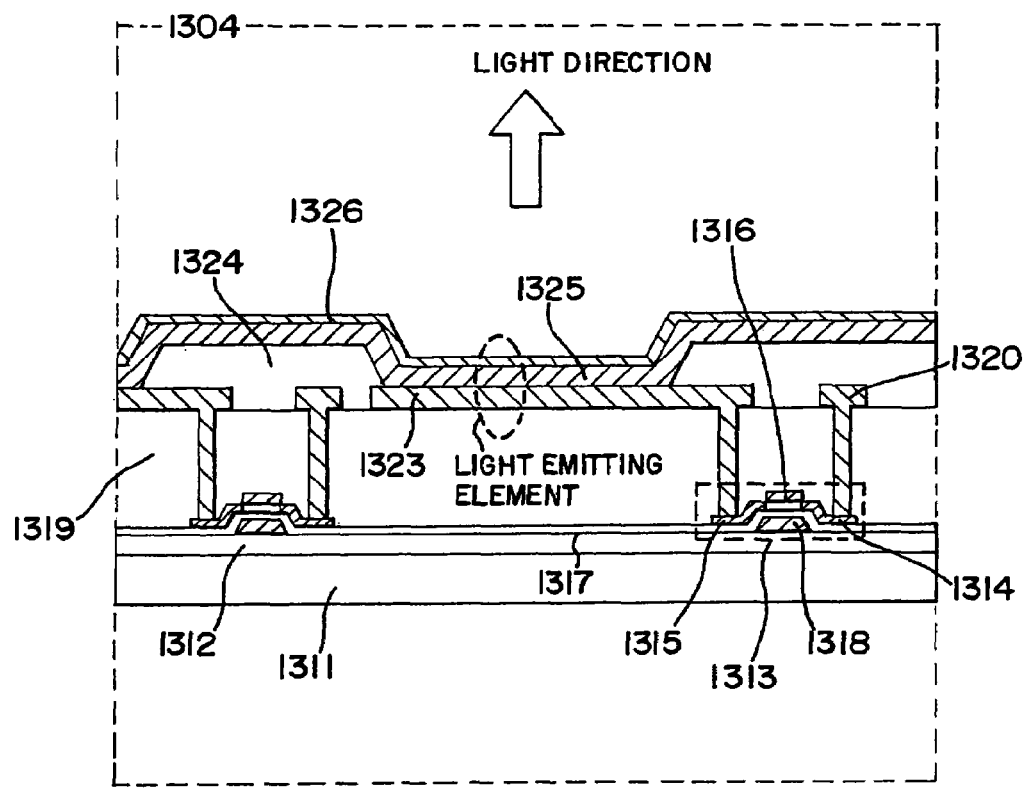

FIG. 13A is a top view of a light emitting device that uses bottom gate TFTs. Note that the sealing in not conducted yet by sealing substrate. A source side driving circuit 1301, a gate side driving circuit 1302, and a pixel portion 1303 are formed therein. FIG. 13B shows in section a region a 1304 of the pixel portion 1303. The sectional view is obtained by cutting the light emitting device along the line x–x' in FIG. 13A.

FIG. 13B illustrates only a current controlling TFT out of TFTs that constituted in a pixel portion 1303. Reference symbol 1311 denotes a substrate and 1312 denotes an insulating film to serve as a base (hereinafter referred to as a base film). A transparent substrate is used for the substrate 1311, typically, a glass substrate, a quartz substrate, a glass ceramic substrate, or a crystallized glass substrate. However, the one that can withstand the highest process temperature during the manufacture process has to be chosen.

The base film 1312 is effective especially when a substrate containing a movable ion or a conductive substrate is used. If a quartz substrate is used, the base film may be omitted. An insulating film containing silicon is used for the base film 1312. The term insulating film containing silicon herein refers to an insulating film containing oxygen or nitrogen in a given ratio to the content of silicon, specifically, a silicon oxide film, a silicon nitride film, or a silicon oxynitride film (SiOxNy: x and y are arbitrary integers).

Reference symbol 1313 denotes a current controlling TFT that is a p-channel TFT. Note that, in this embodiment, anode 1323 of light emitting element 1329 is connected the current control TFT 1313. Therefore, the anode 1323 are preferably made from p-channel TFT but also made from n-channel TFT.

The current controlling TFT 1313 is composed of an active layer which comprising source region 1314, drain region 1315 and channel forming region 1316, a gate insulating film 1317, a gate electrode 1318, a interlayer insulating film 1319, a source wiring line 1320, and a drain wiring line 1321.

The switching TFT has a drain region connected to the gate electrode 1318 of the current controlling TFT 1313. The gate electrode 1318 of the current controlling TFT 1313 is electrically connected to the drain region (not shown) of the switching TFT through a drain wiring line (not shown), to be exact. The gate electrode 1318 has a single gate structure but may take a multi-gate structure. The source wiring line 1320 of the current controlling TFT 1313 is connected to a current supplying line (not shown).

The current controlling TFT 1313 is an element for controlling the amount of current supplied to the light emitting element, and a relatively large amount of current flows through this TFT. Therefore, it is preferable to design the current controlling TFT to have a channel width (W) wider than the channel width of the switching TFT. It is also preferable to design the current controlling TFT to have a rather long channel length (L) in order to avoid excessive current flow in the current controlling TFT 1313. Desirably, the length is set such that the current is 0.5 to 2 µA (preferably 1 to 1.5 µA) per pixel.

If the active layer (channel forming region, in particular) of the current controlling TFT 1313 is formed thick (desirably 50 to 100 nm, more desirably 60 to 80 nm), degradation of the TFT can be slowed.

After the current controlling TFT 1313 is formed, the interlayer insulating film 1319 is formed and anode 1323 that is electrically connected to the current controlling TFT 1313 is formed. In this embodiment, anode 1323 and the wiring line 1320 are formed at the same time and same material. As the materials of anode 1323, the conductive film having small working function is preferably used. In this embodiment, the anode 1323 formed from Al.

After the anode 1323 is formed, an insulating film 1324 is formed. The insulating film 1324 serves as a so-called bank.

A layer comprising at least one organic compound 1325 is formed next, and the cathode 1326 is formed thereon. Materials for the layer comprising at least one organic compound 1325 are shown in Embodiments 1 or 2.

The cathode 1326 is formed on the layer comprising at least one organic compound 1325. Materials for the cathode 1326, transparent conductive film having small work function are used. In this embodiment, the cathode 1326 is formed by laminating Al having a thickness of 20 nm on CaF having the thickness of 2 nm.

Therefore, the light emitting device having the reverse stagger type TFT can be formed. In addition, in the light emitting device according to this embodiment, the light is emitted in the direction shown by arrow of FIG. 13B (upward).

Since the structure of the reverse stagger TFT is easier to reduce the manufacturing step than top gate TFT, the structure have an advantage of reducing the manufacturing cost which is the problem to be solved in the present invention.

Further, the structure of this embodiment can be implemented by freely combining with the structure shown in Embodiments 1 to 4 except the TFT's configuration.

[Embodiment 6]

Figure 14:
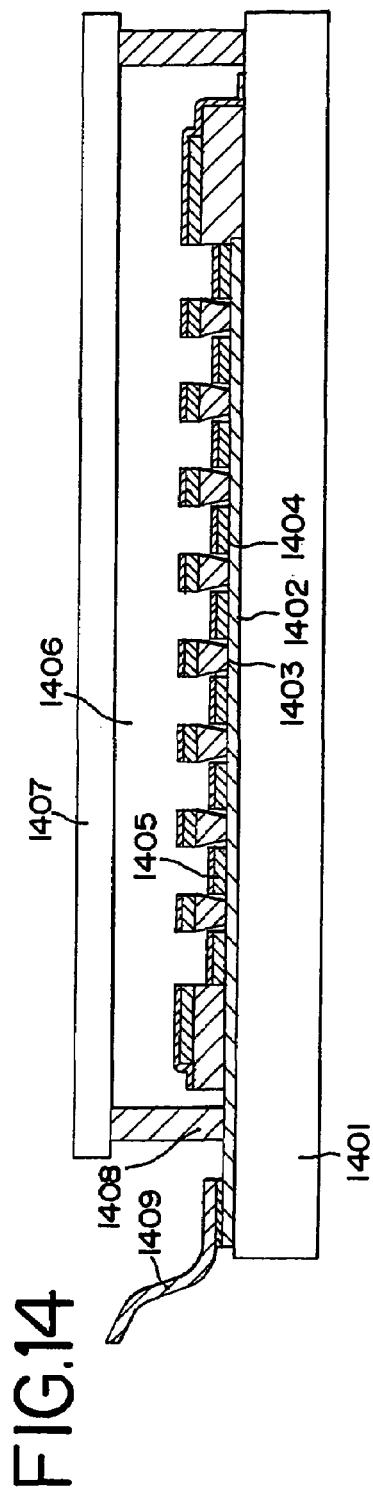
FIG. 14 is a diagram illustrating a passive matrix light emitting device.

In this embodiment, a case in which a passive type (simple matrix type) light emitting device having an element structure of the present invention is manufactured is described with reference to FIG. 14. In FIG. 14, reference numbers 1401 and 1402 represent a glass substrate and an anode made of a metal compound film, respectively. In this embodiment, TiN is formed by sputtering as metal compounds. Not shown in FIG. 14, plural anodes are arranged in the stripe form in parallel with the paper. In the passive matrix light emitting device, since the anode material is required higher conductivity than active matrix light emitting device, it is effective that higher conductive metal compounds than ITO that is used conventionally is used for the anode in reducing the driving voltage of the light emitting element.

Banks 1403 made of an insulating material are formed to cross the anode 1402 arranged in the stripe form. The banks 1403 are formed perpendicularly to the paper face to contact the anodes 1402.

Next, a layer comprising at least one organic compound 1404 is formed. As the material which makes the layer comprising at least one organic compound 1404, a known material which can give luminescence, as well as the materials described in Embodiments 1 and 2, can be used.

For example, by forming a layer comprising at least one organic compound giving red luminescence, a layer comprising at least one organic compound giving green luminescence, and a layer comprising at least one organic compound giving blue luminescence, a light emitting device giving three types of luminescence rays can be formed. Since the layer comprising at least one organic compound 1404 composed of these layers is formed along grooves made in the banks 1403, the layer 1404 is arranged in the stripe form perpendicular to the paper face.

Next, a cathode 1405 is formed on the layer comprising at least one organic compound 1404. The cathode 1405 is formed by vapor deposition using a metal mask.

Since the lower electrodes (the anodes 1402) are transparent materials in this embodiment, light generated at the layer comprising at least one organic compound 1404 is radiated upward (opposed to the substrate 1401).

Next, a glass substrate is prepared as a sealing substrate 1407. Since the sealing substrate 1407 may have transparency in the structure of this embodiment, a substrate made of plastic or quartz may be used as well as glass substrate.

The sealing substrate 1407 is adhered to the substrate 1401 with a sealant 1408 made of an ultraviolet hardening resin. The inside 1406 of the sealant 1408 is an airtightly-closed space, and the inside is filled with an inert gas such as nitrogen or argon. It is effective to put a moisture absorbent, a typical example of which is barium oxide, in the airtightly closed space 1406. At last, a flexible printed circuit (FPC) 1409 is fitted to the anodes to complete a passive type light emitting device.

This embodiment may be carried out by combining materials except the element structure (active matrix type) shown in Embodiments 1 to 5.

[Embodiment 7]

Being self-luminous, a light emitting device using a light emitting element has better visibility in bright places and wider viewing angle than liquid crystal display devices. Therefore, various electric appliances can be completed by using the light emitting device of the present invention.

Given as examples of an electric appliance that employs a light emitting device manufactured in accordance with the present invention are video cameras, digital cameras, goggle type displays (head mounted displays), navigation systems, audio reproducing devices (such as car audio and audio components), notebook computers, game machines, portable information terminals (such as mobile computers, cellular phones, portable game machines, and electronic books), and image reproducing devices equipped with recording media (specifically, devices with a display device that can reproduce data in a recording medium such as a digital video disk (DVD) to display an image of the data). Wide viewing angle is important particularly for portable information terminals because their screens are often slanted when they are looked at. Therefore it is preferable for portable information terminals to employ the light emitting device using the light emitting element. Specific examples of these electric appliance are shown in FIGS. 16A to 16H.

Figure 16A:
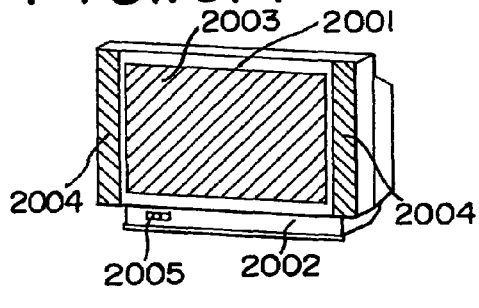
FIGS. 16A to 16H are diagrams showing examples of electric appliances.

FIG. 16A shows a display device, which is composed of a case 2001, a support base 2002, a display unit 2003, speaker units 2004, a video input terminal 2005, etc. The light emitting device manufactured in accordance with the present invention can be applied to the display unit 2003. Since the light emitting device having the light emitting element is self-luminous, the device does not need back light and can make a thinner display unit than liquid crystal display devices. The display device refers to all display devices for displaying information, including ones for personal computers, for TV broadcasting reception, and for advertisement.

Figure 16B:
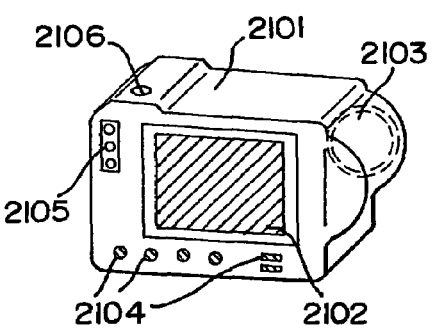

FIG. 16B shows a digital still camera, which is composed of a main body 2101, a display unit 2102, an image receiving unit 2103, operation keys 2104, an external connection port 2105, a shutter 2106, etc. The light emitting device manufactured in accordance with the present invention can be applied to the display unit 2102.

Figure 16C:
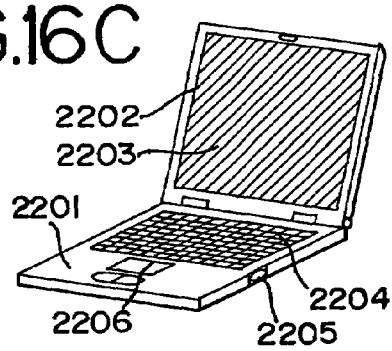

FIG. 16C shows a notebook personal computer, which is composed of a main body 2201, a case 2202, a display unit 2203, a keyboard 2204, an external connection port 2205, a pointing mouse 2206, etc. The light emitting device manufactured in accordance with the present invention can be applied to the display unit 2203.

Figure 16D:
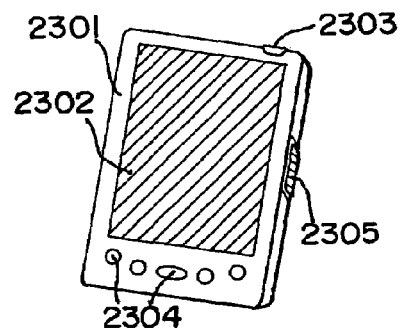

FIG. 16D shows a mobile computer, which is composed of a main body 2301, a display unit 2302, a switch 2303, operation keys 2304, an infrared port 2305, etc. The light emitting device manufactured in accordance with the present invention can be applied to the display unit 2302.

Figure 16E:
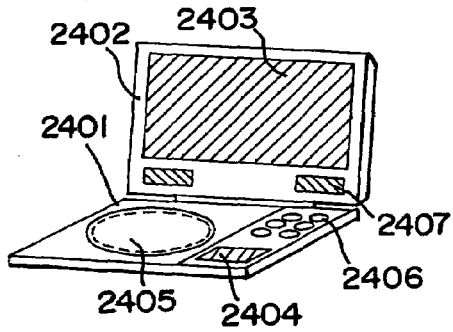

FIG. 16E shows a portable image reproducing device equipped with a recording medium (a DVD player, to be specific). The device is composed of a main body 2401, a case 2402, a display unit A 2403, a display unit B 2404, a recording medium (DVD or the like) reading unit 2405, operation keys 2406, speaker units 2407, etc. The display unit A 2403 mainly displays image information whereas the display unit B 2404 mainly displays text information. The light emitting device manufactured in accordance with the present invention can be applied to the display units A 2403 and B 2404. The image reproducing device equipped with a recording medium also includes home-video game machines.

Figure 16F:
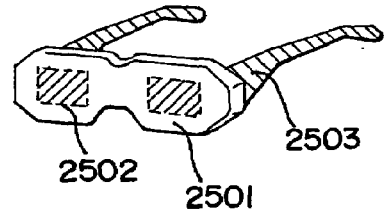

FIG. 16F shows a goggle type display (head mounted display), which is composed of a main body 2501, display units 2502, and arm units 2503. The light emitting device manufactured in accordance with the present invention can be applied to the display units 2502.

Figure 16G:
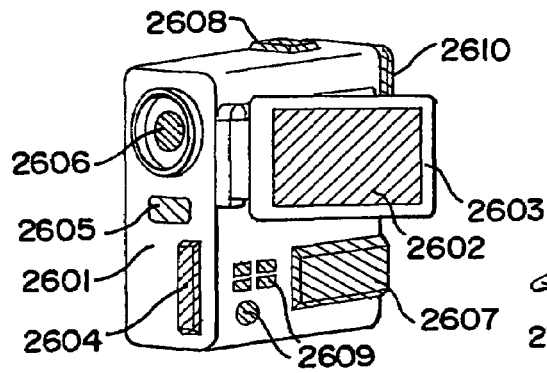

FIG. 16G shows a video camera, which is composed of a main body 2601, a display unit 2602, a case 2603, an external connection port 2604, a remote control receiving unit 2605, an image receiving unit 2606, a battery 2607, an audio input unit 2608, operation keys 2609, eye piece portion 2610 etc. The light emitting device manufactured in accordance with the present invention can be applied to the display unit 2602.

Figure 16H:
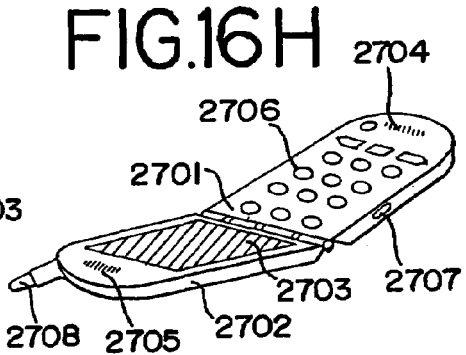
Figure 17:
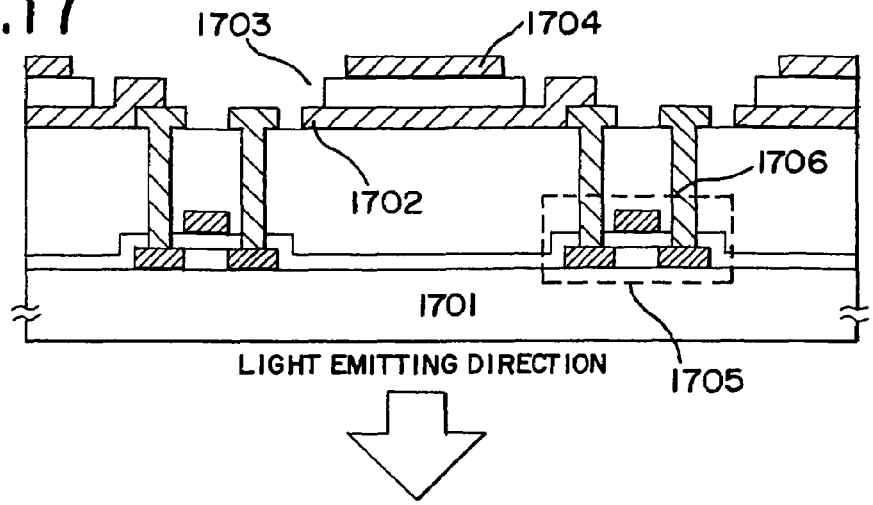
FIG. 17 is a diagram showing an example of prior art.

FIG. 16H shows a cellular phone, which is composed of a main body 2701, a case 2702, a display unit 2703, an audio input unit 2704, an audio output unit 2705, operation keys 2706, an external connection port 2707, an antenna 2708, etc. The light emitting device manufactured in accordance with the present invention can be applied to the display unit 2703. If the display unit 2703 displays white letters on black background, the cellular phone consumes less power.

If the luminance of light emitted from organic materials is raised in future, the light emitting device can be used in front or rear projectors by enlarging outputted light that contains image information through a lens or the like and projecting the light.

These electric appliances now display with increasing frequency information sent through electronic communication lines such as the Internet and CATV (cable television), especially, animation information. Since organic materials have very fast response speed, the light emitting device is suitable for animation display.

In the light emitting device, light emitting portions consume power and therefore it is preferable to display information in a manner that requires less light emitting portions. When using the light emitting device in display units of portable information terminals, particularly cellular phones and audio reproducing devices that mainly display text information, it is preferable to drive the device such that non-light emitting portions form a background and light emitting portions form text information.

As described above, the application range of the light emitting device manufactured by using the deposition device of the present invention is so wide that it is applicable to electric appliances of any field. The electric appliances of this embodiment can be completed by using the light emitting device formed by implementing Embodiments 1 to 5.

In the present invention, by using the light-shielding metal compound as the anode material, the anode of the light emitting element can be formed at the same time when the wire for electrically connecting the anode to a thin film transistor (hereinafter referred to as TFT) for driving the light emitting element is formed in manufacturing the active matrix light emitting device. Accordingly, the present invention is characterized by omitting the process of forming the light-shielding film and the like, which is necessary when the transparent conductive film is used in prior art.

The metal compound used in the present invention has a work function equal to or larger than the work function of ITO or IZO, which is used as an anode material in prior art. By using the metal compound for an anode, injection of holes from the anode can be improved ever more. Also, the metal compound is smaller in resistivity than ITO as to the conductivity. It therefore can fulfill the function as a wire and can lower the drive voltage in the light emitting element compared to prior art.

What is claimed is:

1. A light emitting device comprising an anode, a cathode, and a layer comprising at least one organic compound,
   wherein the layer comprising at least one organic compound is interposed between the anode and the cathode,
   wherein the anode has a light-shielding ability and comprises carbide of an element that belongs to at least one of Group 4, 5 and 6 in the periodic table, and
   wherein the cathode comprises a light-transmissive conductive film.

2. A device according to claim 1, wherein the anode comprises a material having a resistivity of $1\times10^{-2}$ Ωcm or less.

3. An electronic device having the light emitting device according to claim 1, wherein the electronic device is selected from the group consisting of a display device, a camera, a notebook personal computer, a mobile computer, a portable image reproducing device with a recording medium, a goggle-type display, a video camera, and a cellular phone.

4. A device according to claim 1, wherein the anode comprises a material having a work function of 4.7 eV or more.

5. A device according to claim 1, wherein the anode comprises a material selected from the group consisting of titanium carbide, zirconium carbide, tantalum carbide and molybdenum carbide.

6. A light emitting device comprising:
   a thin film transistor comprising a semiconductor film provided on an insulating surface;
   an interlayer insulating film having a contact hole over the semiconductor film;
   an anode on the interlayer insulating film, wherein the anode extends into the contact hole and directly contacts the semiconductor film;
   an insulating layer on the interlayer insulating film, said insulating layer covering an edge of the anode; and
   an organic compound layer on the insulating layer and the anode,
   wherein the anode comprises carbide of an element that belongs to at least one of Group 4, 5 and 6 in the periodic table.

7. A device according to claim 6 further comprising a cathode, wherein the cathode comprises a light-transmissive conductive film.

8. A device according to claim 6, wherein the anode comprises a material having a resistivity of $1\times10^{-2}$ Ωcm or less.

9. A device according to claim 6, wherein the anode comprises a material having a work function of 4.7 eV or more.

10. An electronic device having the light emitting device according to claim 6, wherein the electronic device is selected from the group consisting of a display device, a camera, a notebook personal computer, a mobile computer, a portable image reproducing device with a recording medium, a goggle-type display, a video camera, and a cellular phone.

11. A device according to claim 6, wherein the anode comprises a material selected from the group consisting of titanium carbide, zirconium carbide, tantalum carbide and molybdenum carbide.

12. A light emitting device comprising:
a thin film transistor comprising a semiconductor film provided on an insulating surface;
an interlayer insulating film having a contact hole over the semiconductor film;
an anode on the interlayer insulating film, wherein the anode extends into the contact hole and directly contacts the semiconductor film;
an insulating layer on the interlayer insulating film, said insulating layer covering an edge of the anode; and
an organic compound layer on the insulating layer and the anode,
wherein the anode comprises titanium nitride having a work function of 5.0 eV or more.

13. A device according to claim 12 further comprising a cathode, wherein the cathode comprises a light-transmissive conductive film.

14. A device according to claim 12, wherein the anode comprises a material having a resistivity of $1 \times 10^{-2}$ Ωcm or less.

15. A device according to claim 12, wherein the anode comprises a material having a work function of 4.7 eV or more.

16. An electronic device having the light emitting device according to claim 12, wherein the electronic device is selected from the group consisting of a display device, a camera, a notebook personal computer, a mobile computer, a portable image reproducing device with a recording medium, a goggle-type display, a video camera, and a cellular phone.

17. A light emitting device comprising an anode, a cathode, and a layer comprising at least one organic compound,
wherein the layer comprising at least one organic compound is interposed between the anode and the cathode,
wherein the anode has a light-shielding ability and comprises titanium nitride having a work function of 5.0 eV or more, and
wherein the cathode comprises a light-transmissive conductive film.

18. A device according to claim 17, wherein the anode comprises a material having a resistivity of $1 \times 10^{-2}$ Ωcm or less.

19. An electronic device having the light emitting device according to claim 17, wherein the electronic device is selected from the group consisting of a display device, a camera, a notebook personal computer, a mobile computer, a portable image reproducing device with a recording medium, a goggle-type display, a video camera, and a cellular phone.

20. A light emitting device comprising:
a substrate;
a thin film transistor;
an insulating film over the thin film transistor;
an anode over the insulating film and electrically connected to the thin film transistor;
an electroluminescent layer over the anode; and
a cathode over the electroluminescent layer,
wherein the anode has a light-shielding ability and comprises titanium nitride having a work function of 5.0 eV or more, and
wherein the cathode comprises a light-transmissive conductive film.

21. A device according to claim 20, wherein the anode comprises a material having a resistivity of $1 \times 10^{-2}$ Ωcm or less.

22. An electronic device having the light emitting device according to claim 20, wherein the electronic device is selected from the group consisting of a display device, a camera, a notebook personal computer, a mobile computer, a portable image reproducing device with a recording medium, a goggle-type display, a video camera, and a cellular phone.

* * * * *